(12) United States Patent
Hirano et al.

(10) Patent No.: US 11,506,729 B2
(45) Date of Patent: Nov. 22, 2022

(54) CURRENT SENSOR AND ELECTRIC CONTROL DEVICE

(71) Applicant: TDK Corporation, Tokyo (JP)

(72) Inventors: Hiroyuki Hirano, Tokyo (JP); Makoto Takahashi, Tokyo (JP); Ryoichi Menju, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/499,172

(22) Filed: Oct. 12, 2021

(65) Prior Publication Data
US 2022/0146598 A1    May 12, 2022

(30) Foreign Application Priority Data
Nov. 10, 2020  (JP) .............................. JP2020-187249

(51) Int. Cl.
  *G01R 33/00* (2006.01)
  *G01R 33/09* (2006.01)
  *G01R 33/07* (2006.01)

(52) U.S. Cl.
  CPC ......... *G01R 33/0076* (2013.01); *G01R 33/07* (2013.01); *G01R 33/093* (2013.01); *G01R 33/098* (2013.01)

(58) Field of Classification Search
  CPC ... G01R 33/0076; G01R 33/07; G01R 33/093
  See application file for complete search history.

(56) References Cited

U.S. PATENT DOCUMENTS

| 9,217,760 | B2* | 12/2015 | Akieda | ................ | G01R 15/202 |
| 2017/0285075 | A1* | 10/2017 | Okuyama | ............ | G01R 33/093 |
| 2017/0336443 | A1* | 11/2017 | Yokota | ................ | G01R 15/148 |
| 2018/0321281 | A1* | 11/2018 | Fukuhara | ............. | G01R 15/207 |

(Continued)

FOREIGN PATENT DOCUMENTS

| JP | H5-81731 U | 11/1993 |
| JP | 2001-33491 A | 2/2001 |
| JP | 2005-221492 A | 8/2005 |

(Continued)

*Primary Examiner* — Alvaro E Fortich
(74) *Attorney, Agent, or Firm* — Posz Law Group, PLC

(57) ABSTRACT

A magnetic sensor for detecting magnetism generated from a conductor in which a current flows in a first direction includes a magnetic detection unit capable of detecting the magnetism, a magnetization core, and a magnetic shield. The magnetization core includes a first core section, which is substantially parallel to the first direction, and a second core section and third core section, which are each continuous from both end portions of the first core section in a second direction that is orthogonal to the first direction. The second core section and the third core section each extend from an end portion of the first core section to follow a third direction that is orthogonal to the first direction and the second direction. The magnetic detection unit has a sensitivity direction in the second direction and is positioned in a core gap sandwiched between the vicinity of the end portion of the second core section and the vicinity of the end portion of the third core section in the third direction. The magnetic shield includes a plate-shaped shield portion positioned to overlap the core gap when viewed along the third direction.

14 Claims, 27 Drawing Sheets

(56) References Cited

U.S. PATENT DOCUMENTS

2018/0321283 A1* 11/2018 Sei .......................... G01R 3/00

FOREIGN PATENT DOCUMENTS

| JP | 2008-190920 A | 8/2008 |
| JP | 2010-44025 A | 2/2010 |
| JP | 2011-220983 A | 11/2011 |
| JP | 2013-228315 A | 11/2013 |
| JP | 2014-126384 A | 7/2014 |
| JP | 2016-148620 A | 8/2016 |
| JP | 2019-78542 A | 5/2019 |
| JP | 2020-176192 A | 10/2020 |

* cited by examiner

CURRENT SENSOR AND ELECTRIC CONTROL DEVICE

CROSS REFERENCE TO RELATED APPLICATION

This application is based on and claims priority to Japanese Patent Application No. 2020-187249 filed on Nov. 10, 2020, the disclosure of which is incorporated herein by reference.

TECHNICAL FIELD

The present invention relates to a current sensor and an electric control device.

BACKGROUND

In recent years, current sensors have been used in measurement of the remaining battery level and measurement of motor drive currents in hybrid electric vehicles (HEVs), electric vehicles (EVs) and the like, and in power control equipment such as converters, inverters, and the like. As such a current sensor, one has been known that is provided with a magnetic sensor including a magnetic detection element capable of detecting a magnetic field generated by a current flowing through a conductor such as a bus bar. In the current sensor, for example a magnetoresistive effect element such as an AMR element, a GMR element, or a TMR element, or a magnetic detection element such as a Hall element, detects a current flowing through a conductor such as a bus bar in a non-contact state.

Conventionally, a current sensor has been known that has a ring-shaped magnetic core having a gap, and a magnetic sensor including a magnetic detection element is arranged in the gap (see Patent Literature 1). By having such a structure, the magnetic flux generated from the conductor can be focused on the magnetic core, and the magnetic flux focused by the magnetic core can be applied to the magnetic detection element arranged in the gap.

RELATED LITERATURE

PATENT LITERATURE 1 JP Laid-Open Patent Application No. 2019-78542 OVERVIEW OF THE INVENTION Problem to be Solved by the Invention In the current sensor disclosed in Patent Literature 1, when the current flowing through the conductor becomes relatively large, the magnetic field generated from the conductor becomes strong, making it easy for the magnetic core to be magnetically saturated, and consequently the linearity of the magnetic sensor output may deteriorate. By widening the gap in the magnetic core or increasing the volume of the magnetic core, the deterioration of the linearity of the magnetic sensor output can be improved. However, if the gap in the magnetic core is widened, a magnetic field other than the magnetic field generated from the conductor (hereinafter at times referred to as "disturbance magnetic field") is easily applied to the magnetic detection element, and there is a concern that detection accuracy by the current sensor may decrease.

In consideration of the foregoing problem, it is an object of the present invention to provide a current sensor and an electric control device capable of suppressing the influence of a disturbance magnetic field.

Means for Solving the Problem

To resolve the above problem, the present invention provides a magnetic sensor for detecting magnetism generated from a conductor in which a current flows in a first direction, the magnetic sensor including: a magnetic detection unit capable of detecting the magnetism; a magnetization core; and a magnetic shield, and the magnetization core includes a first core section, which is substantially parallel to the first direction, and a second core section and a third core section, which are each continuous from end portions of the first core section in a second direction that is orthogonal to the first direction. The second core section and the third core section each extend from the end portions of the first core section to follow a third direction that is orthogonal to the first direction and the second direction. The magnetic detection unit has a sensitivity direction in the second direction and is positioned in a core gap sandwiched between the vicinity of an end portion of the second core section and the vicinity of an end portion of the third core section in the third direction. The magnetic shield includes a plate-shaped shield portion positioned to overlap the core gap when viewed along the third direction.

The magnetization core may further include a fourth core section, which is continuous with the vicinity of the end portion of the second core section, and a fifth core section, which is continuous with the vicinity of the end portion of the third core section. The fourth core section and the fifth core section may extend to approach one another along the second direction. The conductor may be a plate-shaped body extending in the first direction and a thickness direction in the second direction, and the conductor may be a plate-shaped body extending in the first direction and a thickness direction in the third direction.

The magnetic shield may include a first shield portion and a second shield portion that extend along the third direction and are respectively continuous with ends of the plate-shaped shield portion along the first direction, and the magnetic detection unit is positioned in the core gap sandwiched between the first shield portion and the second shield portion when viewed along the first direction.

A slit section penetrating in the third direction may be formed in the plate-shaped shield portion, and the lengthwise direction of the slit section may substantially match the first direction when viewed along the third direction. The lengthwise direction of the slit section may substantially match the second direction when viewed along the third direction, and the slit section may be one of a plurality of slit sections formed in the plate-shaped shield portion.

The iron loss of the constituent materials of the magnetic shield may be larger than the iron loss of the constituent materials of the magnetization core, the magnetic detection unit may include a magnetoresistive effect element or a Hall element, the magnetoresistive effect element may be a GMR element or a TMR element, and the conductor may be provided to penetrate the gap formed by the first core section, the second core section and the third core section of the magnetization core along the first direction. The present invention provides an electric control device provided with the above-described current sensor.

Efficacy of the Invention

With the present invention, it is possible to provide a current sensor and an electric control device capable of suppressing the influence of a disturbance magnetic field.

BEST MODE FOR IMPLEMENTING THE INVENTION

Figure 1:
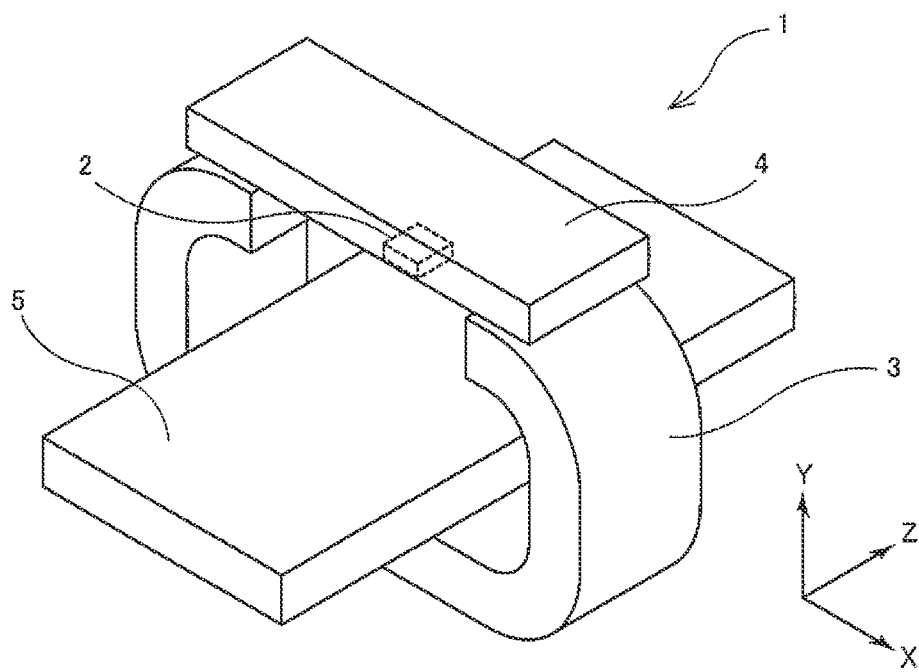
FIG. 1 is a perspective view showing a schematic configuration of a first aspect of the current sensor according to the embodiment of the present invention.
Figure 2:
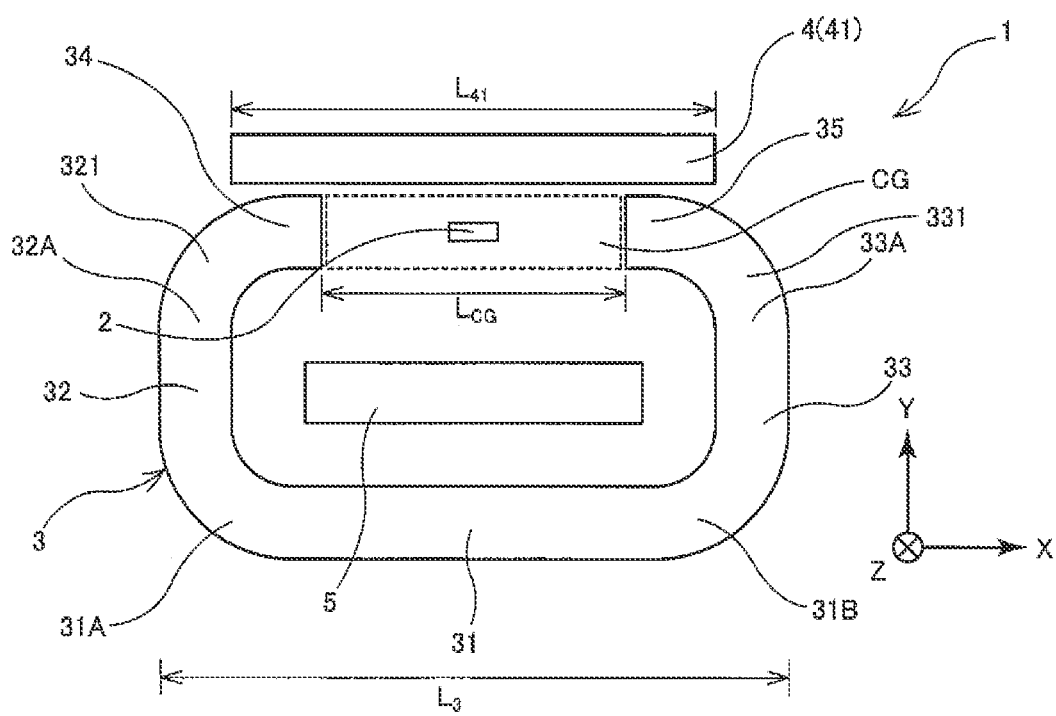
FIG. 2 is a side view showing a schematic configuration of a first aspect of the current sensor according to the embodiment of the present invention.
Figure 3:
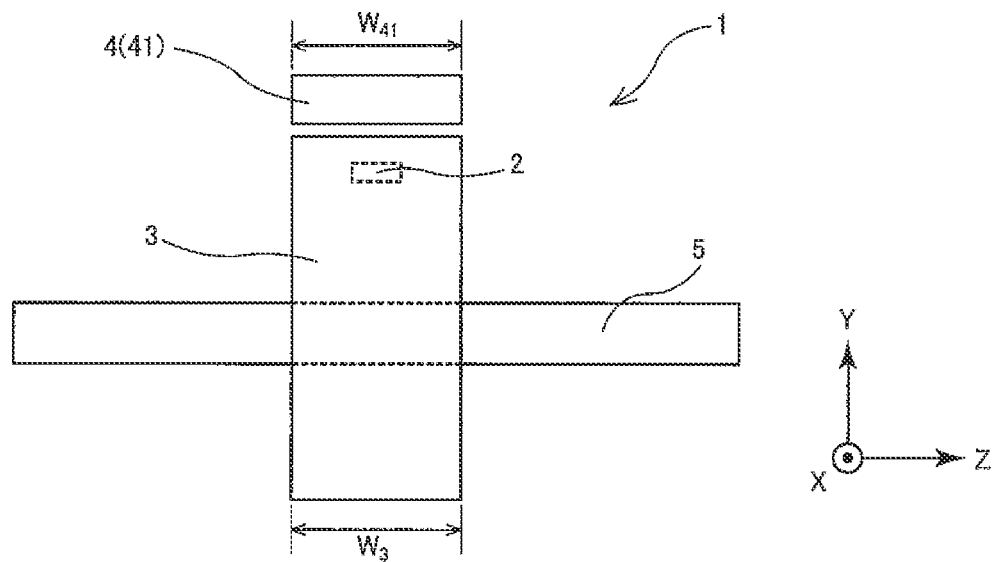
FIG. 3 is a side view showing a schematic configuration of a first aspect of the current sensor according to the embodiment of the present invention.
Figure 4:
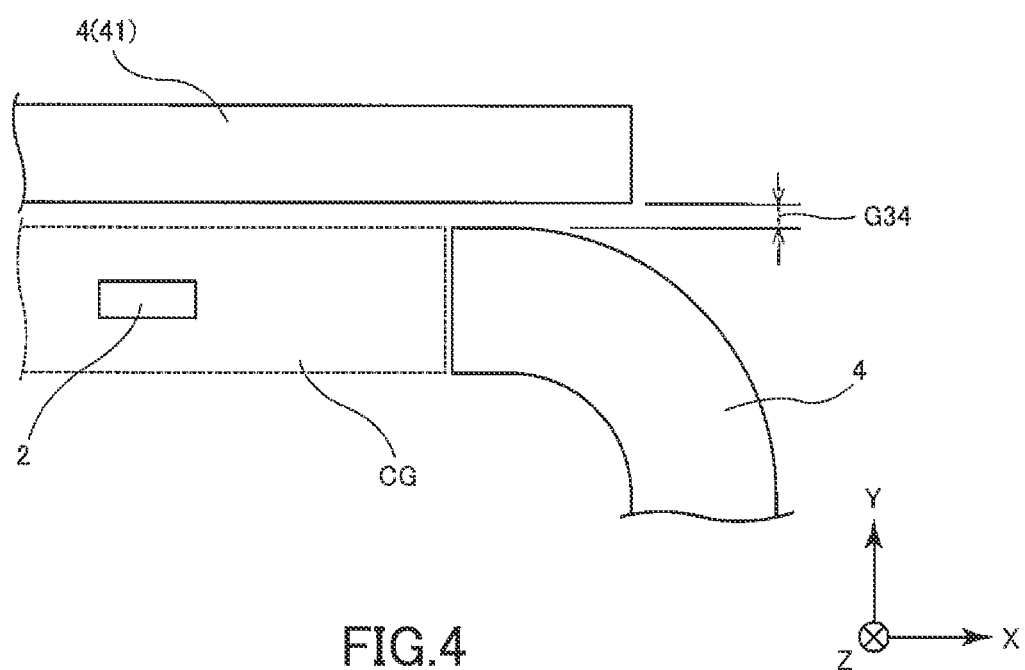
FIG. 4 is a partial, enlarged cutaway end view showing a schematic configuration of a first aspect of the current sensor according to the embodiment of the present invention.

An embodiment of the present invention will be described with reference to the drawings. FIG. 1 is a perspective view showing a schematic configuration of a first aspect of the current sensor according to this embodiment, FIG. 2 is a side view showing a schematic configuration of the first aspect of the current sensor according to this embodiment, FIG. 3 is a side view showing a schematic configuration of the first aspect of the current sensor according to this embodiment, and FIG. 4 is a partially enlarged cutaway end view showing a schematic configuration of the first aspect of the current sensor according to this embodiment.

In describing the present embodiment, a "first direction, second direction and third direction" are specified in some drawings as necessary. Here, the first direction is the direction of the current flowing through the conductor. The second direction is a direction orthogonal to the first direction and is the width direction of the conductor in the first to third aspects and the fifth aspect and the thickness direction of the conductor in the fourth aspect. The third direction is a direction orthogonal to the first direction and the second direction and is the thickness direction of the conductor in the first to third aspects and the fifth aspect and the width direction of the conductor in the fourth aspect. In the present specification and drawings, the first direction is at times referred to as the "Z direction", the second direction as the "X direction", and the third direction as the "Y direction".

As shown in FIGS. 1 to 4, the first aspect of the current sensor 1 according to the present embodiment is provided with a magnetic detection unit 2 capable of detecting magnetism, a magnetization core 3, a magnetic shield 4 and a conductor 5 through which an electric current flows in the Z direction.

The magnetization core 3 includes a first core section 31 substantially parallel to the Z direction, a second core section 32 and a third core section 33 that are continuous with both end portions 31A and 31B of the first core section 31 in the X direction and extend in the Y direction (+Y direction), a fourth core section 34 that is continuous with the end portion 32A of the second core section 32 in the Y direction and extends in the X direction (−X direction), and a fifth core section 35 that is continuous with the end portion 33A of the third core section 33 in the Y direction and extends in the X direction (+X direction). The fourth core section 34 and the fifth core section 35 extend along the X direction from the end portion 32A of the second core section 32 and the end portion 33A of the third core section 33 so that the end faces thereof are close to each other. The gap (space) sandwiched between the end face of the fourth core section 34 and the end face of the fifth core section 35 facing each other is a core gap CG. That is to say, the magnetization core 3 is a ring-shaped core having the core gap CG and is a substantially C-shaped core when viewed along the Z direction.

In the present embodiment, the continuous portion between the end portion 31A of the first core section 31 and the second core section 32 of the magnetization core 3, the continuous portion between the end portion 31B of the first core section 31 and the third core section 33, the continuous portion between the end portion 32A of the second core section 32 and the fourth core section 34, and the continuous portion between the end portion 33A of the third core section 33 and the fifth core section 35 are all curved (rounded shape), but this is intended to be illustrative and not limiting. For example, these continuous portions may have a bent shape (a shape having corners) or a chamfered C shape with chamfered corners.

The length $L_{CG}$ (the distance in the X direction between the end face of the fourth core section 34 and the end face of the fifth core section 35) of the core gap CG in the X direction can be, for example, 6 mm or more, and can be about 6~12 mm. By having the length $L_{CG}$ be 6 mm or more, the effect of the current sensor 1 according to the present embodiment being provided with the magnetic shield 4, that is, the effect of controlling, by means of the magnetic shield 4, disturbance magnetic fields applied to the magnetic detection unit 2, can be effectively achieved.

Figure 5A:
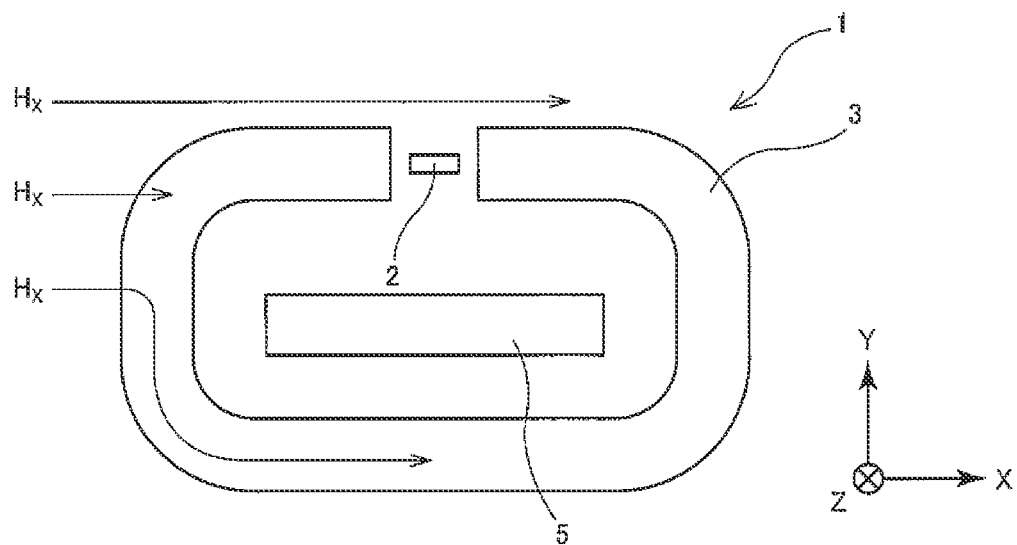
FIG. 5A is a side view for explaining the influence of a disturbance magnetic field in the X direction on a current sensor having a magnetization core with a relatively narrow core gap and not having a magnetic shield.
Figure 5B:
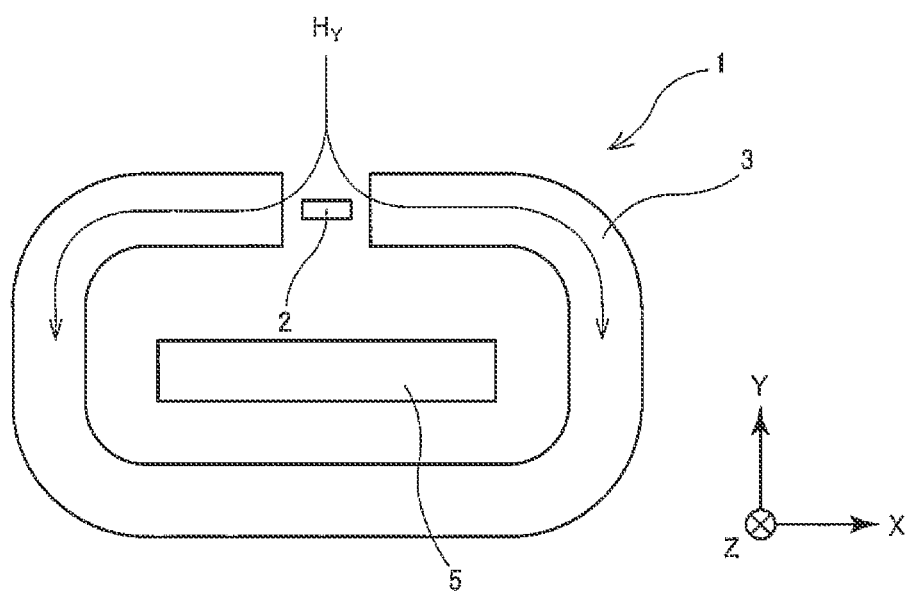
FIG. 5B is a side view for explaining the influence of a disturbance magnetic field in the Y direction on a current sensor having a magnetization core with a relatively narrow core gap and not having a magnetic shield.
Figure 6A:
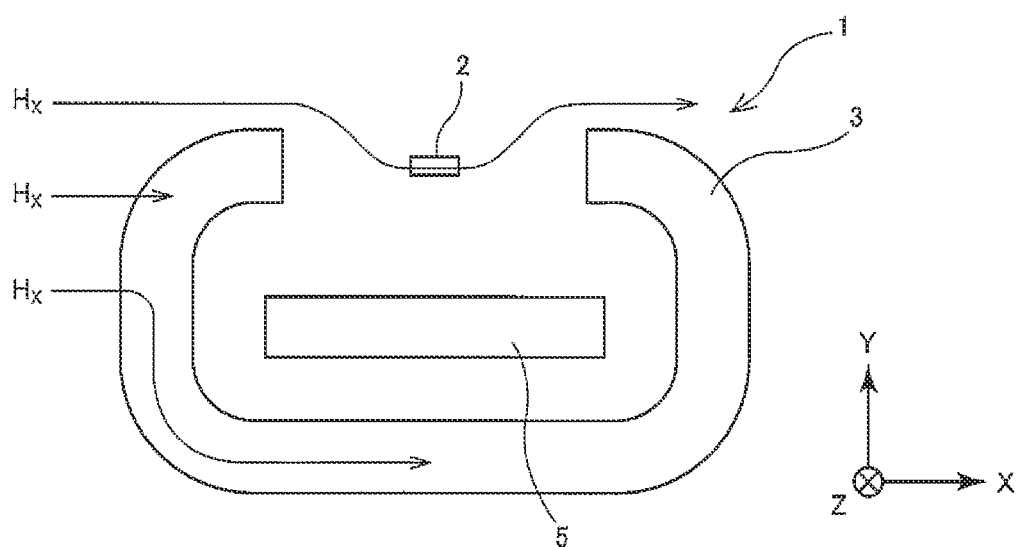
FIG. 6A is a side view for explaining the influence of a disturbance magnetic field in the X direction on a current sensor having a magnetization core with a relatively wide core gap and not having a magnetic shield.
Figure 6B:
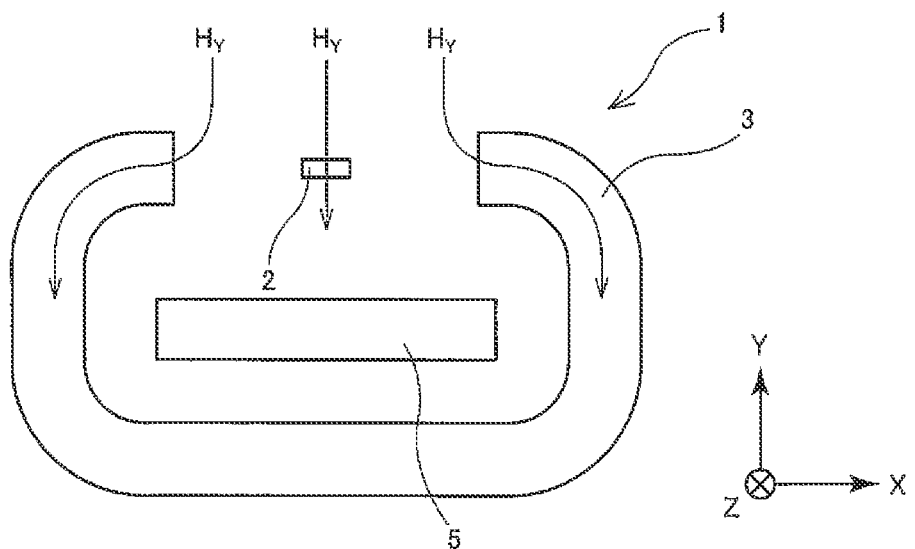
FIG. 6B is a side view for explaining the influence of a disturbance magnetic field in the Y direction on a current sensor having a magnetization core with a relatively wide core gap and not having a magnetic shield.
Figure 6C:
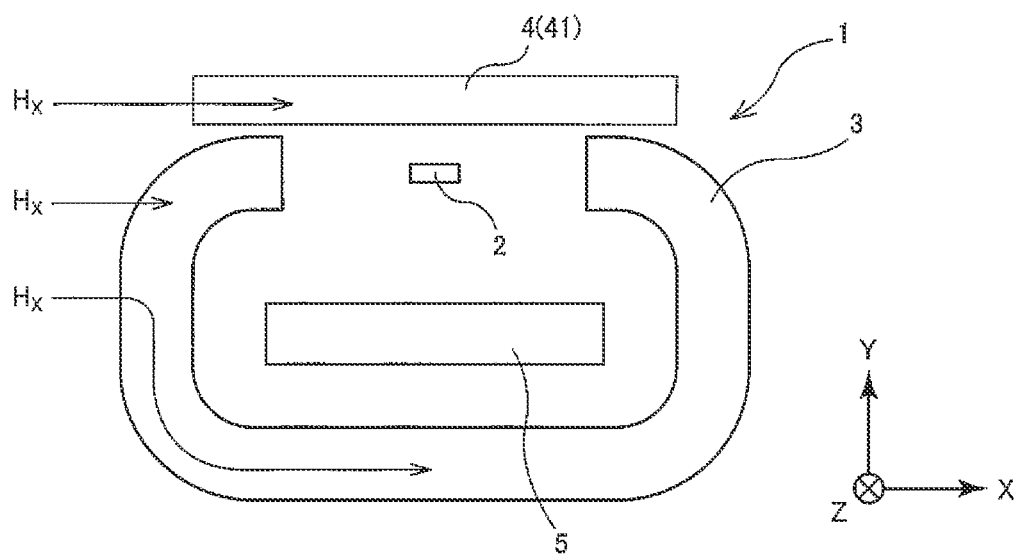
FIG. 6C is a side view for explaining the influence of a disturbance magnetic field in the X direction on a current sensor having a magnetization core with a relatively wide core gap and having a magnetic shield.
Figure 7:
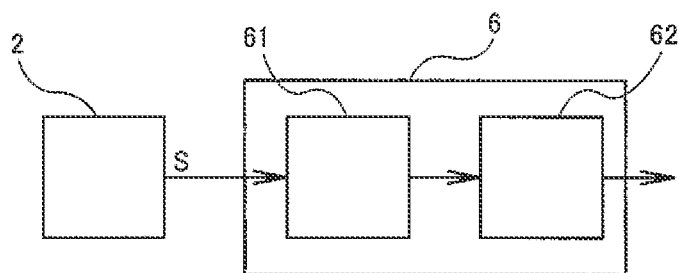
FIG. 7 is a block diagram showing a schematic configuration of the current sensor according to the embodiment of the present invention.
Figure 8:
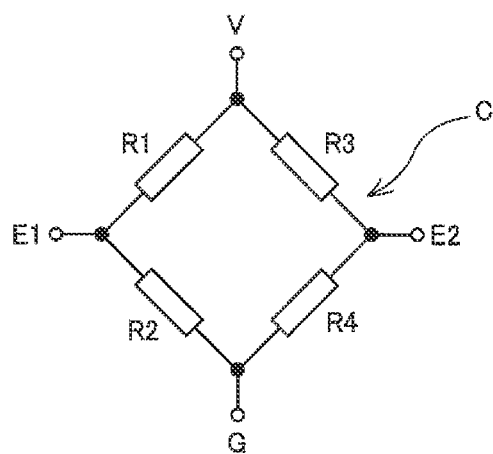
FIG. 8 is a circuit diagram schematically showing a circuit configuration of the magnetic detection unit according to the embodiment of the present invention.
Figure 9:
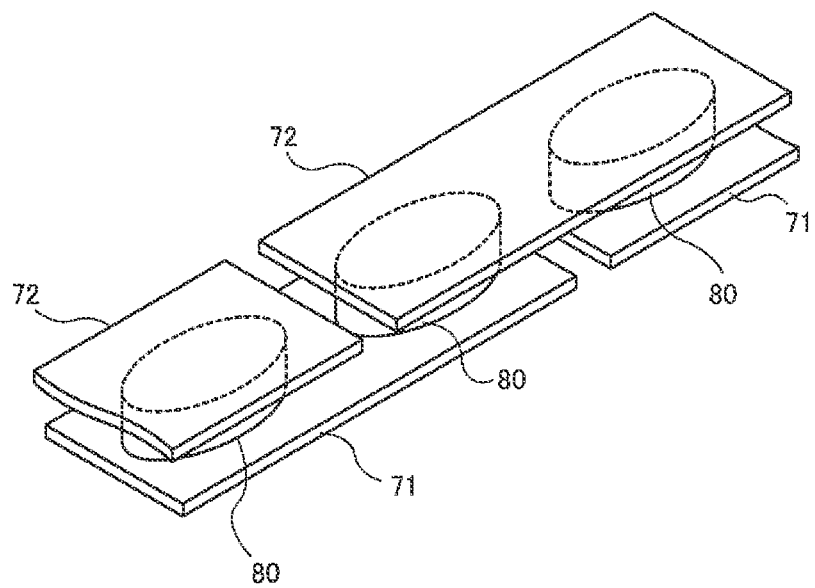
FIG. 9 is a perspective view showing the schematic configuration of one aspect of the magnetoresistive effect element according to the embodiment of the present invention.
Figure 10:
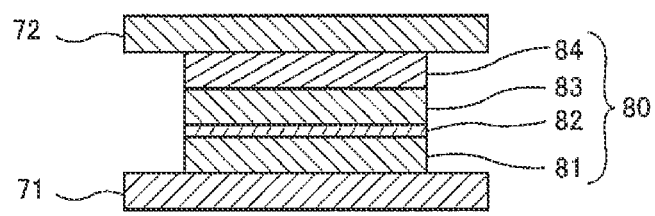
FIG. 10 is a cutaway end view showing the schematic configuration of one aspect of the magnetoresistive effect element according to the embodiment of the present invention.

Assuming that the current sensor 1 according to the present embodiment is not provided with the magnetic shield 4, if the length $L_{CG}$ of the core gap CG in the X direction is relatively small and the end face of the fourth core section 34 and the end face of the fifth core section 35 are close to the magnetic detection unit 2, both the disturbance magnetic field $H_X$ in the X direction and the disturbance magnetic field $H_Y$ in the Y direction are absorbed by the magnetization core 3 and are unlikely to be applied to the magnetic detection unit 2 (see FIG. 5A and FIG. 5B). That is, the current sensor is less susceptible to the influence of the disturbance magnetic fields $H_X$ and $H_Y$. On the other hand, when the current flowing through the conductor 5 becomes large, the magnetization core 3 tends to become magnetically saturated and there is a concern that the linearity of the output of the magnetic detection unit 2 may deteriorate. When the length $L_{CG}$ of the core gap CG in the X direction is made relatively large (for example, 6 mm or more) and the end face of the fourth core section 34 and end face of the fifth core section 35 are separated from the magnetic detection unit 2 in order to improve the linearity of the output of the magnetic detection unit 2, although the magnetization core 3 is less likely to be magnetically saturated, both the disturbance magnetic field $H_X$ in the X direction and the disturbance magnetic field $H_Y$ in the Y direction become more readily applied to the magnetic detection unit 2 (see FIG. 6A and FIG. 6B). By the magnetic shield 4 being provided to overlap the core gap CG when viewed along the Y direction as in the current sensor 1 according to the present embodiment, it is possible for at least the disturbance magnetic field $H_X$ in the X direction to be induced on the magnetization core 3 and the magnetic shield 4 (see FIG. 6C). Consequently, it is possible to suppress at least the disturbance magnetic field $H_X$ in the X direction from being applied to the magnetic detection unit 2.

The width $W_3$ of the magnetization core 3 in the Z direction can be about 5~20 mm. In the current sensor 1 according to the present embodiment, the magnetic detection unit 2 is arranged in the core gap CG of the magnetization core 3, but when the width $W_3$ is relatively small (for example, less than 5 mm), there is a concern that the magnetization core 3 could easily become magnetically saturated by magnetic flux generated from the conductor 5. On the other hand, when the width $W_3$ becomes relatively large, the size of the current sensor 1 becomes relatively large.

The length $G_{34}$ of the gap between the magnetic shield 4 and the magnetization core 3 in the Y direction can be, for example, 3 mm or less, and can be about 1~2 mm. If the length $G_{34}$ of the gap exceeds 3 mm, there is a concern that the disturbance magnetic field Hz, in the X direction may pass through the gap and be applied to the magnetic detection unit 2. Further, if the length $G_{34}$ of the gap is relatively short (for example, less than 1 mm), a magnetic path is formed from the magnetization core 3 to the magnetic shield 4 and magnetic flux easily flows through the magnetic shield 4, and consequently the magnetization core 3 readily becomes magnetically saturated and there is a concern that the magnetic flux to be detected by the magnetic detection unit 2 may decrease.

The conductor 5 made of copper or the like is a plate-like body whose lengthwise direction is substantially parallel to the Z direction and whose thickness direction is substantially parallel to the Y direction and is provided to penetrate, in the Z direction, the inside of the magnetization core 3 having the core gap CG. The lengthwise direction of the conductor 5 can be substantially parallel to the Z direction, and for example, the axis of the conductor 5 (the line passing through the center of the conductor 5) can intersect the Z direction at an angle of 2° or less. Furthermore, the thickness direction of the conductor 5 can be substantially parallel to the Y direction and can intersect the Y direction at an angle of 2° or less, for example.

The magnetic detection unit 2 can be provided in the core gap CG. In the first aspect of the current sensor 1 according to the present embodiment, when a current flows through the conductor 5, a magnetic flux is generated from the conductor 5, and the magnetic flux is focused on the ring-shaped magnetization core 3 having the core gap CG. Since the magnetization core 3 has a ring shape having the core gap CG, the entire magnetization core 3 including the core gap CG becomes a magnetic flux path (magnetic path). That is, it can be said that the magnetic detection unit 2 provided in the core gap CG is located in the path (magnetic path) of the magnetic flux focused on the magnetization core 3. Therefore, in the present embodiment, "the magnetic detection unit 2 is provided in the core gap CG" means that the magnetic detection unit 2 only needs to be located on the magnetic path, and the whole of the magnetic detection unit 2 may be located within the core gap CG, or a part of the magnetic detection unit 2 may be located within the core gap CG. A detailed configuration of the magnetic detection unit 2 will be described later.

The magnetic shield 4 includes a plate-shaped shield portion 41 that overlaps the core gap CG when viewed along the Y direction. By having the plate-shaped shield portion 41 overlap the core gap CG when viewed along the Y direction, the disturbance magnetic field $H_X$ in the X direction is induced on the magnetization core 3 and the magnetic shield 4. Therefore, it is possible to prevent the disturbance magnetic field $H_X$ in the X direction from being applied to the magnetic detection unit 2.

In the present embodiment, the magnetic shield 4 is arranged so that the plate-shaped shield portion 41 completely overlaps the core gap CG when viewed along the Y direction. That is, the length $L_{41}$ of the plate-shaped shield portion 41 of the magnetic shield 4 in the X direction can be longer than the length $L_{CG}$ of the core gap CG in the X direction and can be no greater than the length $L_3$ of the magnetization core 3 in the X direction. When the length $L_{41}$ of the plate-shaped shield portion 41 in the X direction is relatively long, the shielding effect against the disturbance magnetic field $H_X$ in the X direction can be improved. Furthermore, the length $W_{41}$ of the plate-shaped shield portion 41 in the Z direction can be at least as great as the length of the core gap CG in the Z direction, that is, the width $W_3$ of the magnetization core 3 in the Z direction. For example, the length $L_{41}$ of the plate-shaped shield portion 41 in the X direction can be at least 4 mm more than the length $L_{CG}$ of the core gap CG in the X direction and not more than the length $L_3$ of the magnetization core 3 in the X direction, and the length $W_{41}$ in the Z direction can be at least as great as the width $W_3$ of the magnetization core 3 in the Z direction and around 8 mm more than the width $W_3$ of the magnetization core 3 in the Z direction. The current sensor 1 according to the present embodiment is not limited to this aspect. For example, the plate-shaped shield portion 41 need not completely overlap the core gap CG as long as the magnetic shield 4 can prevent at least the disturbance magnetic field $H_X$ in the X direction from being applied to the magnetic detection unit 2.

The thickness (length in the Y direction) of the plate-shaped shield portion 41 is not particularly limited, but can be, for example, about 1~3 mm. If the thickness is relatively small (for example, less than 1 mm), the magnetic shield 4 tends to become saturated, and the linearity of the output from the current sensor 1 may be adversely affected. On the other hand, when the thickness is relatively large, there is a concern of the effect on the manufacturing cost of the current sensor 1 and the height dimension of the current sensor 1.

The magnetization core 3 and the magnetic shield 4 can both be made of soft magnetic materials such as silicon steel, electromagnetic steel, pure iron (SUY), permalloy or the like, but from the viewpoint of cost reduction, silicon steel, electromagnetic steel, pure iron, or the like is preferable. The iron loss of the constituent material of the magnetic shield 4 can be larger than the iron loss of the constituent material of the magnetization core 3. When a predetermined current flows through the conductor 5, the magnetic field generated from the conductor 5 flows through the magnetization core 3 and the magnetic shield 4. When the frequency of the current flowing through the conductor 5 becomes high, the frequency characteristic of the magnetic shield 4 made of a material having a relatively large iron loss deteriorates, and the magnetic field flowing through the magnetic shield 4 relatively decreases. The magnetization core 3 made of a material having a relatively small iron loss also has deterioration in frequency characteristics, making it difficult for the magnetic field to flow, but to the extent that the magnetic field flowing through the magnetic shield 4 is relatively reduced, the magnetic field flowing through magnetization core 3 relatively increases. As a result, it is considered that the magnetic flux density of the magnetic field applied to the magnetic detection unit 2 is stable compared to the current sensor 1 which does not have the magnetic shield 4. This is clear in the test examples described later, but the more the difference in iron loss between the two increases, the more the frequency characteristics are improved and the more it is possible to suppress attenuation of the magnetic flux density of the magnetic field applied to the magnetic detection unit 2 (see FIG. 32). As a result, the response characteristics of the current sensor 1 to alternating current can be stabilized. The difference between the iron loss of the constituent material of the magnetization core 3 and the iron loss of the constituent material of the magnetic shield 4 is preferably 2.0 W/kg or more, and more preferably is 4.5 to 10.0 W/kg, for example. The iron loss is a value found as the magnitude of the iron loss per unit weight (average of the rolling direction and the direction orthogonal thereto) in the case of sinusoidal excitation with a maximum magnetic flux density of 1.5 T at a frequency of 50 Hz according to the Epstein test method based on the JIS-C-2550 standard. The constituent material of the magnetization core 3 may be the same type of material as the constituent material of the magnetic shield 4, or a different type of material, as long as the material has a smaller iron loss than the constituent material of the magnetic shield 4. For example, if the magnetization core 3 and the magnetic shield 4 are both made of electromagnetic steel, the iron loss of the electromagnetic steel constituting the magnetic shield 4 can be larger than the iron loss of the electromagnetic steel constituting the magnetization core 3.

The current sensor 1 according to the present embodiment includes a magnetic detection unit 2 and a signal processing unit 6. The signal processing unit 6 includes an A/D (analog-digital) conversion unit 61 that converts an analog signal output from the magnetic detection unit 2 into a digital signal, and a calculation unit 62 that processes the digital signal that has been digitally converted by the A/D conversion unit 61. When the calculation processing result processed by the calculation unit 62 is output as an analog signal, the signal processing unit 6 can also include a D/A (digital-analog) conversion unit (omitted from drawings) on the downstream side of the calculation unit 62.

In the present embodiment, the circuit configuration of the magnetic detection unit 2 may be a Wheatstone bridge circuit C in which four resistance units, namely a first resistance unit R1, a second resistance unit R2, a third resistance unit R3, and a fourth resistance unit R4, are bridge-connected, or two resistance units, namely the first resistance unit R1 and the second resistance unit R2, may be half bridge-connected. The first to fourth resistance units R1~R4 may include a single magnetoresistive effect element (AMR element, GMR element, TMR element, or the like) or a Hall element, or may include a plurality of magnetoresistive effect elements (AMR elements, GMR elements, TMR elements, or the like) or Hall elements.

The Wheatstone bridge circuit C included in the magnetic detection unit 2 includes a power supply port V, a ground port G, the two output ports E1 and E2, the first resistance unit R1 and the second resistance unit R2 connected in series, and the third resistance unit R3 and the fourth resistance unit R4 connected in series. One end each of the first resistance unit R1 and the third resistance unit R3 is connected to the power supply port V. The other end of the first resistance unit R1 is connected to one end of the second resistance unit R2 and the output port E1. The other end of the third resistance unit R3 is connected to one end of the fourth resistance unit R4 and the output port E2. The other ends of the second resistance unit R2 and the fourth resistance unit R4 are connected to the ground port G. A power supply voltage of a predetermined magnitude is applied to the power supply port V, and the ground port G is connected to ground.

In the present embodiment, the first to fourth resistance units R1~R4 included in the Wheatstone bridge circuit C may include an MR element such as an AMR element, a GMR element, a TMR element, or the like, or may include a Hall element. GMR elements and TMR elements include a magnetization fixed layer in which the magnetization direction is fixed, a free layer in which the magnetization direction changes in accordance with the direction of an impressed magnetic field, and a nonmagnetic layer arranged between the magnetization fixed layer and the free layer. AMR devices include a magnetic layer having shape anisotropy.

MR elements such as GMR elements or TMR elements constituting the first to fourth resistance units R1~R4 can have a plurality of first electrodes 71, a plurality of MR films 80 and a plurality of second electrodes 72. The plurality of first electrodes 71 is provided on a substrate (not shown).

The first electrodes 71 are also referred to as lower lead electrodes. Each first electrode 71 has an elongated shape. A gap is formed between two first electrodes 71 adjacent to each other in the lengthwise direction of the first electrodes 71. MR films 80 are provided on the upper surface of the first electrodes 71 near both ends in the lengthwise direction. The MR film 80 has a substantially circular shape in a plan view, and includes a free layer 81, a nonmagnetic layer 82, a magnetization fixed layer 83 and an antiferromagnetic layer 84 that are layered in this order from the first electrode 71 side. The free layer 81 is electrically connected to the first electrode 71. The antiferromagnetic layer 84 is made of an antiferromagnetic material and plays the role of fixing the direction of magnetization of the magnetization fixed layer 83 by forming an exchange bond with the magnetization fixed layer 83. The plurality of second electrodes 72 is provided on the plurality of MR films 80. Each second electrode 72 has an elongated shape, is arranged on two first electrodes 71 adjacent to each other in the lengthwise direction of the first electrodes 71, and electrically connects the antiferromagnetic layers 84 of the two MR films 80 adjacent to each other. The second electrodes 72 are also referred to as upper lead electrodes. The MR film 80 may have a structure in which the free layer 81, the nonmagnetic layer 82, the magnetization fixed layer 83, and the antiferromagnetic layer 84 are layered in this order from the second electrode 72 side. Furthermore, the antiferromagnetic layer 84 may be omitted by making the magnetization fixed layer 83 have a laminated ferromagnetic structure of a ferromagnetic layer/nonmagnetic intermediate layer/ferromagnetic layer, with both ferromagnetic layers antiferromagnetically coupled, to form a so-called self-pinned fixed layer (Synthetic Ferri Pinned layer, or SFP layer).

In a TMR element, the nonmagnetic layer 82 is a tunnel barrier layer. In a 3R element, the nonmagnetic layer 82 is a nonmagnetic conductive layer. In a TMR element or GMR element, the resistance value changes in accordance with the angle formed by the magnetization direction of the free layer 81 with respect to the magnetization direction of the magnetization fixed layer 83, and the resistance value becomes a minimum when this angle is 0° (the magnetization directions are parallel to each other), and the resistance value becomes a maximum when this angle is 180° (the magnetization directions are antiparallel to each other).

When the first to fourth resistance units R1~R4 are composed of TMR elements or GMR elements, in the Wheatstone bridge circuit C of the magnetic detection unit 2, the magnetization directions of the magnetization fixed layers 83 of the first resistance unit R1 and the second resistance unit R2 are parallel to the X direction, and the magnetization direction of the magnetization fixed layer 83 of the first resistance unit R1 and the magnetization direction of the magnetization fixed layer 83 of the second resistance unit R2 are antiparallel to each other. Furthermore, the magnetization directions of the magnetization fixed layers 83 of the third resistance unit R3 and the fourth resistance unit R4 are parallel to the X direction, and the magnetization directions of the magnetization fixed layer 83 of the third resistance unit R3 and the magnetization direction of the magnetization fixed layer 83 of the fourth resistance unit R4 are antiparallel to each other. In the magnetic detection unit 2, the potential difference between the output ports E1 and E2 changes in accordance with the change in the magnetic field strength of the magnetic field in the X direction generated from the conductor 5, and a signal corresponding to the potential difference between the output ports E1 and E2 is output to the signal processing unit 6 as the sensor signal S. A difference detector (omitted from drawings) amplifies the signal corresponding to the potential difference between the output ports E1 and E2, and outputs the result to the A/D conversion unit 61 of the signal processing unit 6 as the sensor signal S.

The A/D conversion unit 61 converts the sensor signal S (analog signal related to the current) output from the magnetic detection unit 2 into a digital signal, and this digital signal is input into the calculation unit 62. The calculation unit 62 performs calculation processing on the digital signal converted from the analog signal by the A/D conversion unit 61. The calculation unit 62 comprises, for example, a microcomputer, an ASIC (Application Specific Integrated Circuit), or the like.

In the first aspect of the current sensor 1 according to the present embodiment, as shown in FIGS. 11A~11D, a slit section 42 penetrating in the Y direction may be formed in the plate-shaped shield portion 41 of the magnetic shield 4. The slit section 42 may be formed so that the lengthwise direction thereof is substantially parallel to the X direction (see FIG. 11A) or may be formed so that the lengthwise direction thereof is substantially parallel to the Z direction (see FIGS. 11B and 11C) or may be formed so that the lengthwise direction thereof intersects the X and Z directions (see FIG. 11D). One slit section 42 may be formed in the plate-shaped shield portion 41 of the magnetic shield 4 (see FIGS. 11A, 11B and 11D), or a plurality of slit sections 42 may be formed (see FIG. 11C). The slit section 42 may be formed to overlap the magnetic detection unit 2 when viewed along the Y direction, that is, so that at least a portion of the magnetic detection unit 2 is exposed from the slit section 42 (see FIGS. 11A, 11B and 11D) or may be formed so as not to overlap the magnetic detection unit 2 (see FIG. 11C).

Figure 12A:
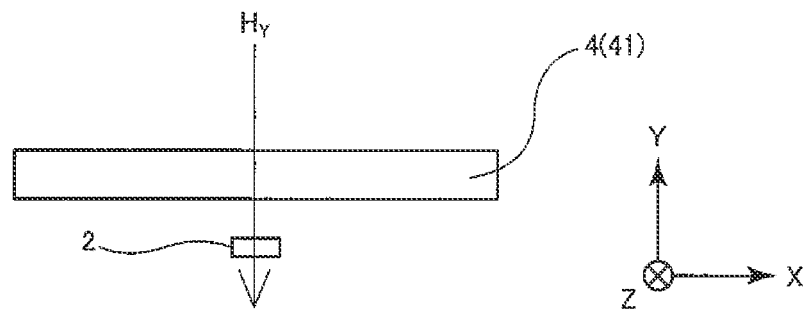
FIG. 12A is a side view for explaining the influence of the disturbance magnetic field in the Y direction on the current sensor according to the embodiment of the present invention.

In the first aspect of the current sensor 1 according to the present embodiment, if the slit section 42 is not formed in the plate-shaped shield portion 41 of the magnetic shield 4, the disturbance magnetic field $H_Y$ in the Y direction permeates the plate-shaped shield portion 41 of the magnetic shield 4 in the thickness direction (see FIG. 12A). Even if the disturbance magnetic field $H_Y$ in the Y direction is applied to the magnetic detection unit 2 having the sensitivity axis in the X direction, usually no significant effect is received. However, if the sensitivity axis of the magnetic detection unit 2 deviates from the X direction to the ±Y direction due to assembly errors of the magnetic detection unit 2 in the current sensor 1, a plate-shaped shield portion 41 in which the slit section 42 is not formed causes the disturbance magnetic field $H_Y$ in the Y direction to permeate in the thickness direction of the plate-shaped shield portion 41, so there is a concern that the current sensor 1 may be affected by the disturbance magnetic field $H_Y$.

Figure 12B:
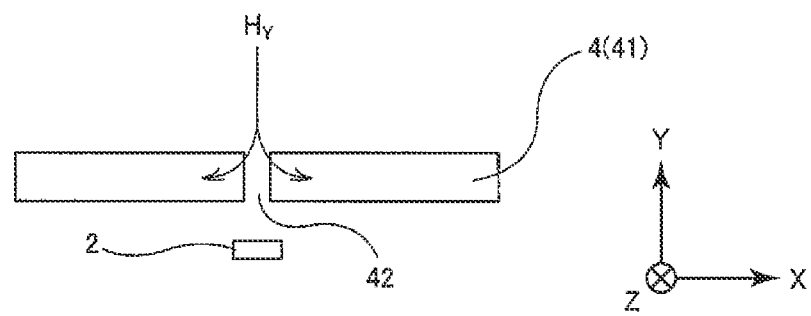
FIG. 12B is a side view for explaining the influence of the disturbance magnetic field in the Y direction on a modified example of the current sensor according to the embodiment of the present invention.

On the other hand, since the slit section 42 is formed in the plate-shaped shield portion 41, the disturbance magnetic field $H_Y$ in the Y direction can be dispersed on both sides of the slit section 42 (both sides in the short direction of the slit section 42 when viewed along the Y direction). Therefore, when the slit section 42 is formed to overlap the magnetic detection unit 2 when viewed along the Y direction, it is possible to prevent the disturbance magnetic field $H_Y$ toward the magnetic detection unit 2 along the Y direction from being applied to the magnetic detection unit 2 (see FIG. 12B).

Figure 12C:
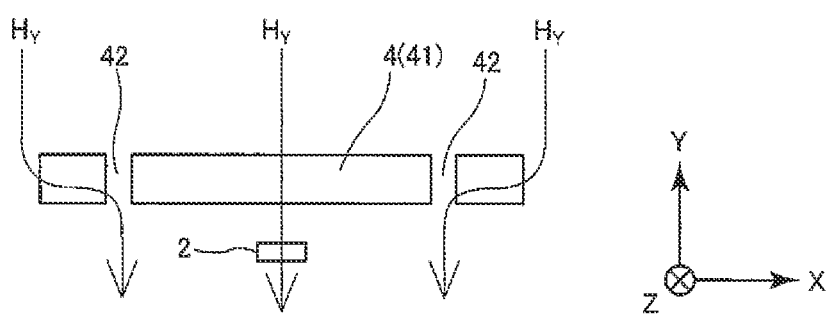
FIG. 12C is a side view for explaining the influence of the disturbance magnetic field in the Y direction on a modified example of the current sensor according to the embodiment of the present invention.

When the slit section 42 is formed so as not to overlap the magnetic detection unit 2 when viewed along the Y direction, it is difficult to prevent the disturbance magnetic field $H_Y$ toward the magnetic detection unit 2 along the Y direction from being applied to the magnetic detection unit 2, but it is possible to suppress the effects of the disturbance magnetic field $H_Y$, which wraps around from the outside of the magnetic shield 4 and is induced by the magnetic shield 4, on the current sensor 1 (see FIG. 12C).

Figure 11A:
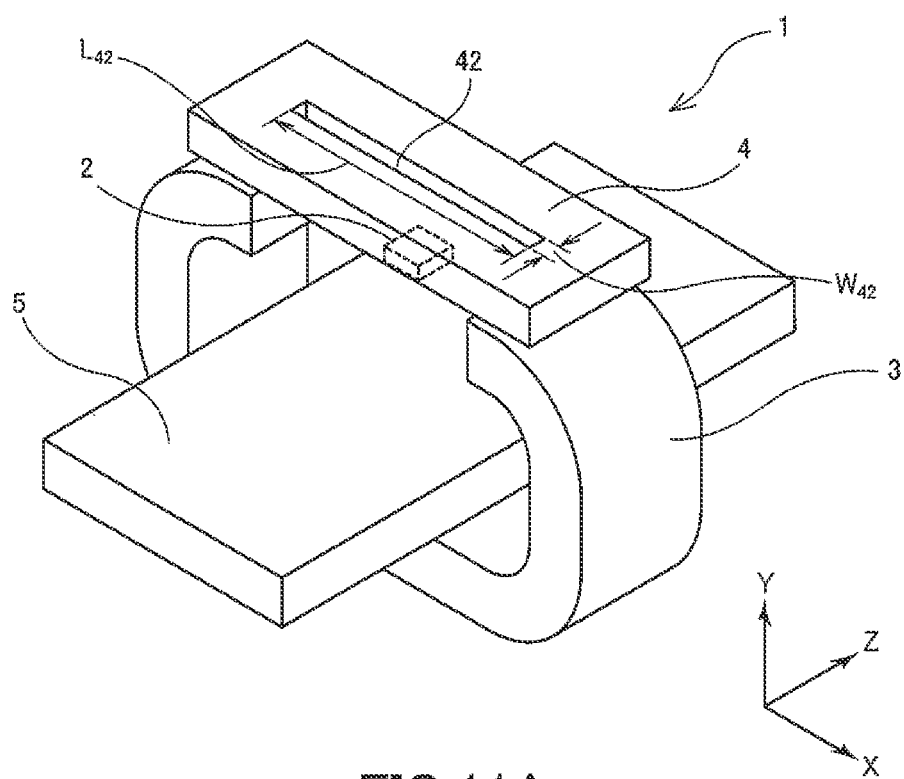
FIG. 11A is a perspective view showing the schematic configuration of a modified example of the first aspect of the current sensor according to the embodiment of the present invention.
Figure 11B:
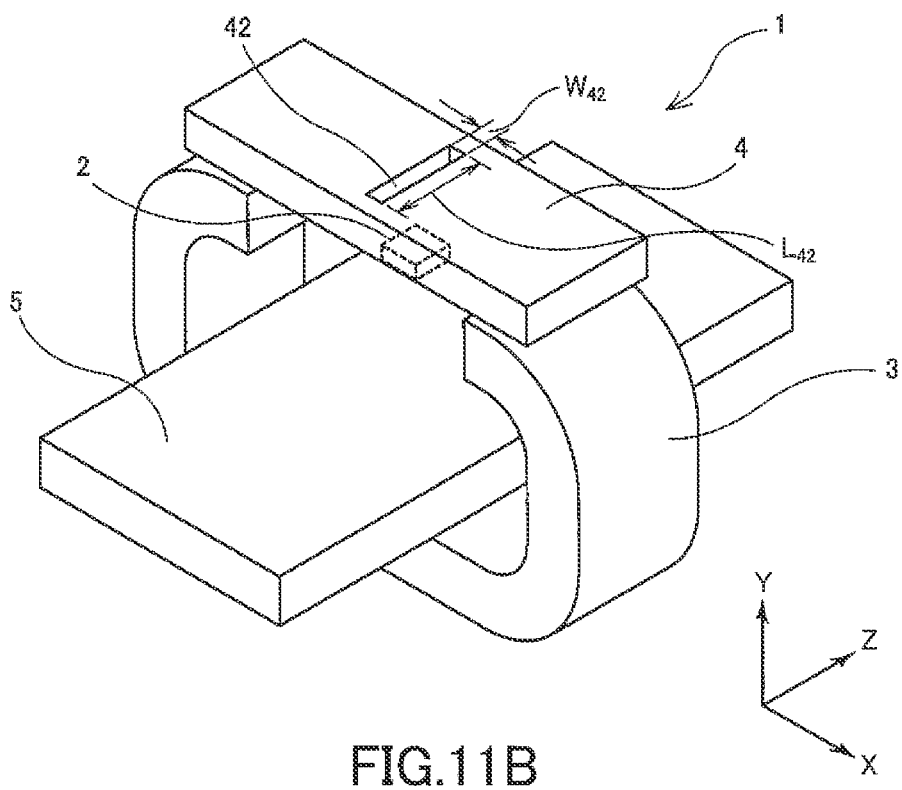
FIG. 11B is a perspective view showing the schematic configuration of a modified example of the first aspect of the current sensor according to the embodiment of the present invention.
Figure 11C:
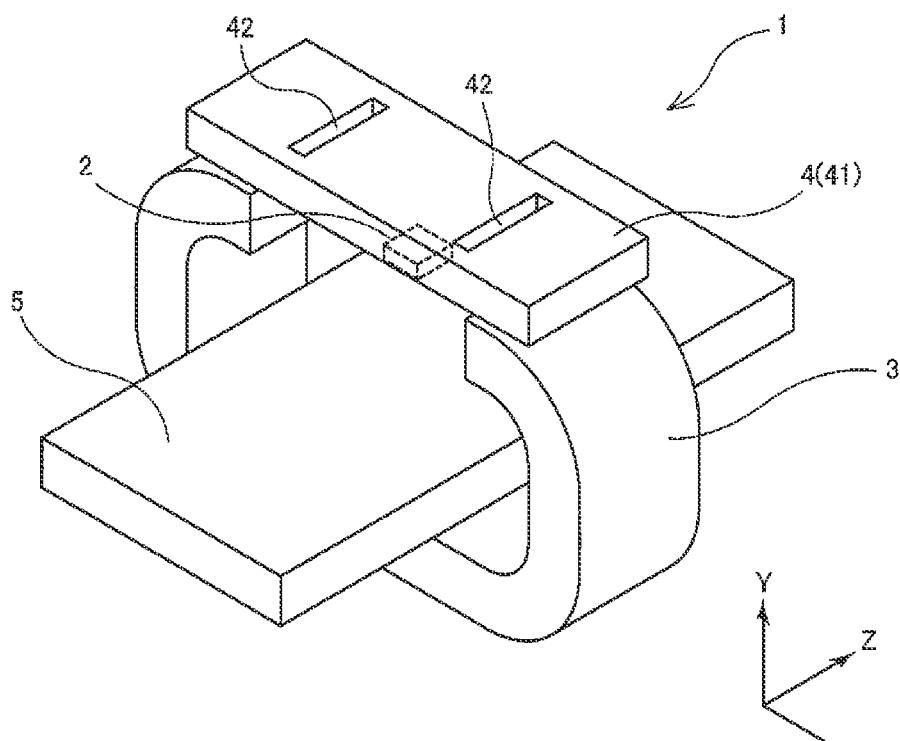
FIG. 11C is a perspective view showing the schematic configuration of a modified example of the first aspect of the current sensor according to the embodiment of the present invention.
Figure 11D:
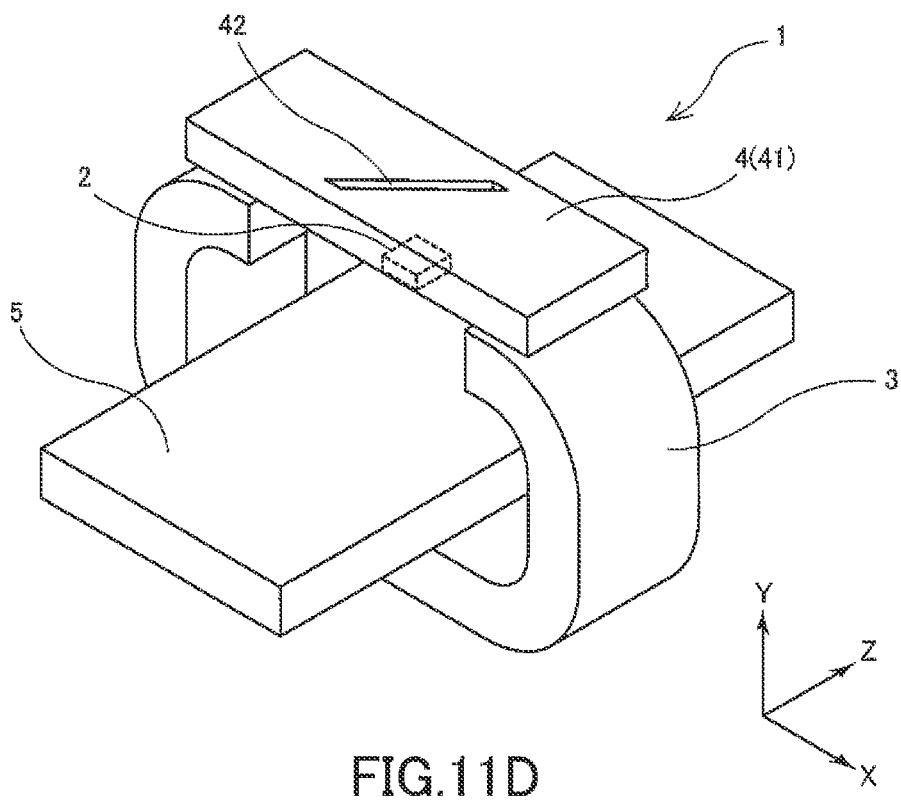
FIG. 11D is a perspective view showing the schematic configuration of a modified example of the first aspect of the current sensor according to the embodiment of the present invention.

In the aspect shown in FIG. 11A, the length $L_{42}$ in the lengthwise direction (X direction) of the slit section 42 may be shorter than or longer than the length $L_{CG}$ of the core gap CG in the X direction or may be the same as the length $L_{CG}$. In the aspect shown in FIGS. 11A~11D, the length $W_{42}$ of the slit section 42 in the short direction should be, for example, about 1~4 mm, and preferably about 2~3 mm. If the length $W_{42}$ is less than 1 mm, the disturbance magnetic field $H_Y$ cannot be effectively dispersed by the slit section 42, and there is a concern that the disturbance magnetic field $H_Y$ will permeate the plate-shaped shield portion 41 of the magnetic shield 4 in the thickness direction. Furthermore, if the length $W_{42}$ exceeds 4 mm, there is a concern that the disturbance magnetic field $H_Y$ in the Y direction may pass through the slit section 42 and be applied to the magnetic detection unit 2.

With the first aspect of the current sensor 1 according to the present embodiment, the magnetic shield 4 is provided to overlap the core gap CG of the magnetization core 2 when viewed from the Y direction, and through this it is possible for the disturbance magnetic field $H_X$ in the X direction to be induced in the magnetization core 2 and the magnetic shield 4, so that it is possible to suppress the effect of the disturbance magnetic field $H_X$. Hence, with the first aspect of the current sensor 1 according to the present embodiment, the current flowing through the conductor 5 can be detected with high accuracy.

A second aspect of the current sensor 1 according to the present embodiment will be described. The same reference numerals are given to the same configurations as those in the first aspect, and detailed description thereof is omitted. As shown in FIGS. 13~16, the second aspect of the current sensor 1 is provided with a magnetic detection unit 2 capable of detecting magnetism, a magnetization core 3, a magnetic shield 4 and a conductor 5 through which a current flows in the Z direction.

The magnetic shield 4 includes a first shield portion 43 and a second shield portion 44 that extend in the Y direction and are continuous with both end portions 41A and 41B of the plate-shaped shield portion 41 in the Z direction. The length $L_{41}$ of the plate-shaped shield portion 41 in the X direction is the same as the length $L_{43}$ of the first shield portion 43 in the X direction and the length of the second shield portion 44 in the X direction. That is, the magnetic shield 4 has a substantially U shape when viewed along the X direction.

In the second aspect of the current sensor 1 according to the present embodiment, the magnetic shield 4 includes the first shield portion 43 and the second shield portion 44 that are continuous with both end portions 41A and 41B of the plate-shaped shield portion 41 in the Z direction. The first shield portion 43 and the second shield portion 44 extend in the –Y direction from both end portions 41A and 41B of the plate-shaped shield portion 41. Since the magnetic shield 4 includes the first shield portion 43 and the second shield portion 44, the disturbance magnetic field $H_Y$ in the Y direction is induced in the first shield portion 43 and the second shield portion 44 (see FIG. 17A), so it is possible prevent the disturbance magnetic field $H_Y$ from being applied to the magnetic detection unit 2. Furthermore, since the disturbance magnetic field $H_X$ in the X direction is induced from the fourth core section 34 or the fifth core section 35 of the magnetization core 3 to the first shield portion 43 and the second shield portion 44 (see FIG. 17B), it is possible to prevent the disturbance magnetic field $H_X$ from being applied to the magnetic detection unit 2.

Figure 16:
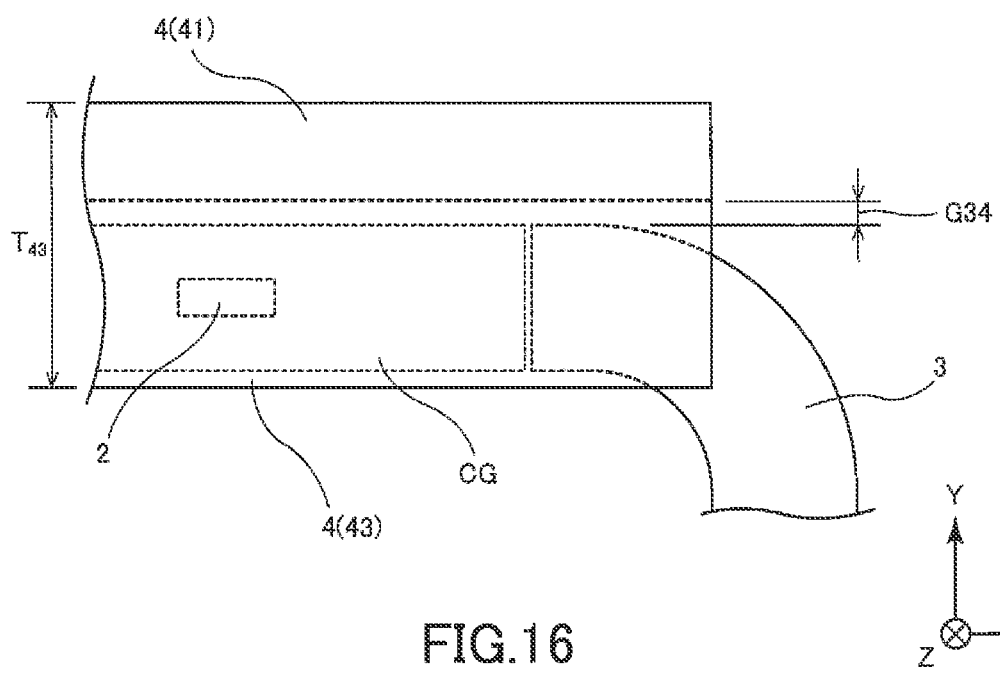
FIG. 16 is a partial, enlarged cutaway end view showing a schematic configuration of the second aspect of the current sensor according to the embodiment of the present invention.

The lengths $T_{43}$ and $T_{44}$ of the first shield portion 43 and the second shield portion 44 in the Y direction are not particularly limited as long as such do not come into contact with the conductor 5, but when viewed along the Z direction, it is preferable that the length be at least great enough to completely overlap the core gap CG (see FIG. 16). By having the first shield portion 43 and the second shield portion 44 completely overlap the core gap CG when viewed along the Z direction, it is possible to effectively prevent both the disturbance magnetic field $H_X$ in the X direction and the disturbance magnetic field $H_Y$ in the Y direction from being applied to the magnetic detection unit 2. The lengths $T_{43}$ and $T_{44}$ can be, for example, about 6~10 mm. The length $T_{43}$ of the first shield portion 43 in the Y direction and the length $T_{44}$ of the second shield portion 44 in the Y direction may be the same as each other or may be different from each other.

In the present embodiment, both end portions 41A and 41B of the plate-shaped shield portion 41 and the continuous portions of the first shield portion 43 and the second shield portion 44 all have a curved shape (rounded shape), but this is intended to be illustrative and not limiting. For example, these continuous portions may have a bent shape (a shape having corners) or a chamfered C shape with chamfered corners.

In the second aspect of the current sensor 1 according to the present embodiment, as shown in FIGS. 18A~18D, a slit section 42 penetrating in the Y direction may be formed in the plate-shaped shield portion 41 of the magnetic shield 4. The slit section 42 may be formed so that the lengthwise direction thereof is substantially parallel to the X direction (see FIG. 18A) or may be formed so that the lengthwise direction thereof is substantially parallel to the Z direction (see FIGS. 18B and 18C) or may be formed so that the lengthwise direction thereof intersects the X and Z directions (see FIG. 18D). One slit section 42 may be formed in the plate-shaped shield portion 41 of the magnetic shield 4 (see FIGS. 18A, 18B and 18D), or a plurality of slit sections 42 may be formed (see FIG. 18C). The slit section 42 may be formed to overlap the magnetic detection unit 2 when viewed along the Y direction, that is, so that at least a part of the magnetic detection unit 2 is exposed from the slit section 42 (see FIGS. 18A, 18B and 18D), or may be formed to not overlap the magnetic detection unit 2 (see FIG. 18C).

Figure 17A:
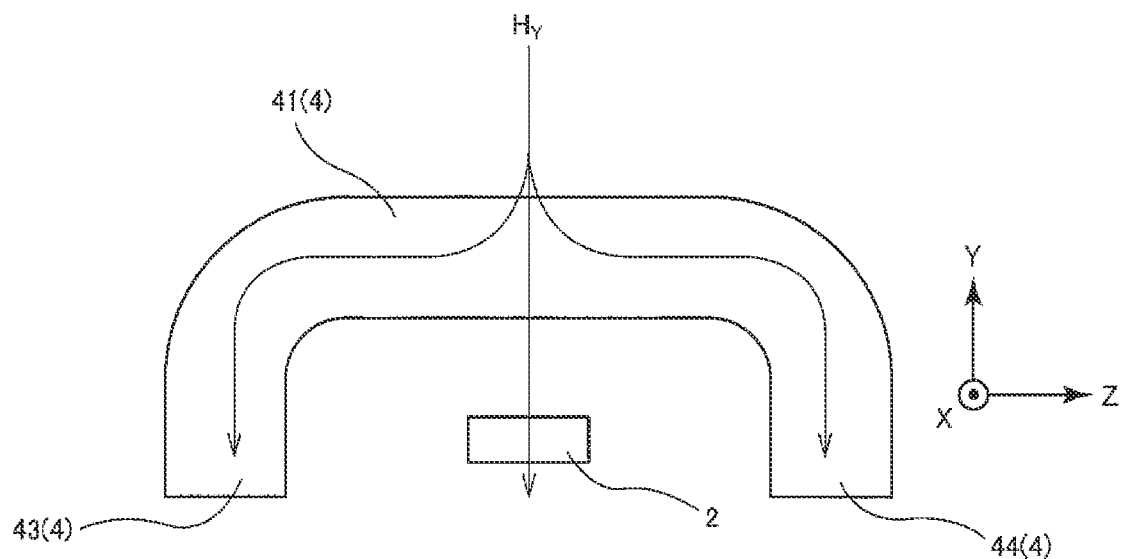
FIG. 17A is a side view for explaining the influence of a disturbance magnetic field in the Y direction on the second aspect of the current sensor according to the embodiment of the present invention.
Figure 17B:
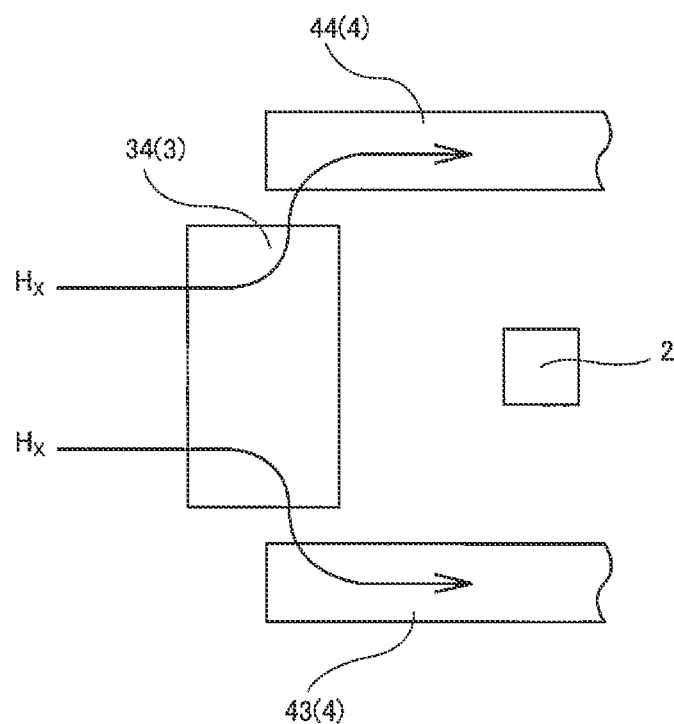
FIG. 17B is a side view for explaining the influence of a disturbance magnetic field in the X direction on the second aspect of the current sensor according to the embodiment of the present invention.

In the second aspect of the current sensor 1 according to the present embodiment, the disturbance magnetic field $H_Y$ in the Y direction is readily induced on the first shield portion 43 and the second shield portion 44, but when the slit section 42 is not formed in the plate-shaped shield portion 41 of the magnetic shield 4, part of the disturbance magnetic field $H_Y$ in the Y direction is transmitted in the thickness direction of the plate-shaped shield portion 41 of the magnetic shield 4 (see FIG. 17A). As a result, there is a concern that the current sensor 1 may be affected by the disturbance magnetic field $H_Y$.

Figure 19:
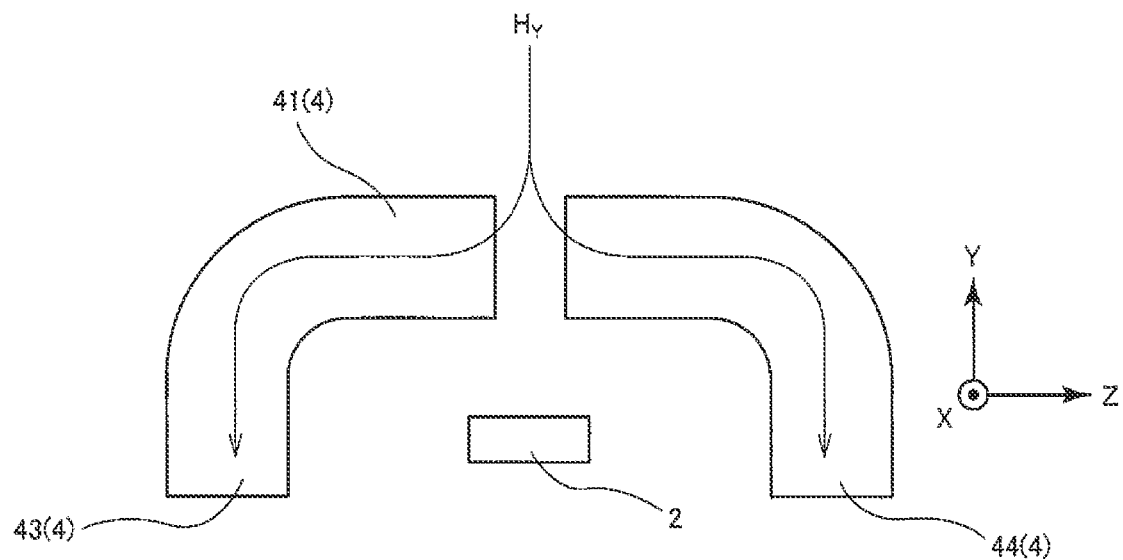
FIG. 19 is a side view for explaining the influence of the disturbance magnetic field in the Y direction on the modified example of the second aspect of the current sensor according to the embodiment of the present invention.

On the other hand, by forming the slit section 42 in the plate-shaped shield portion 41, it is possible to disburse the disturbance magnetic field $H_Y$ in the Y direction to both sides of the slit section 42 (both sides in the short direction (Z direction) of the slit section 42 when viewed along the Y direction), and it becomes easier to induce the disturbance magnetic field $H_Y$ on the first shield portion 43 and the second shield portion 44 more effectively. Consequently, when the slit section 42 is formed to overlap the magnetic detection unit 2 when viewed along the Y direction, the disturbance magnetic field $H_Y$ toward the magnetic detection unit 2 along the Y direction can be effectively prevented from being applied to the magnetic detection unit 2 (see FIG. 19).

When the slit section 42 is formed to avoid overlapping the magnetic detection unit 2 when viewed along the Y direction, it is possible to prevent the disturbance magnetic $H_Y$ field wrapped around from the outside of the magnetic shield 4 and induced on the magnetic shield 4 from affecting the current sensor 1 (see FIG. 12C).

Figure 18A:
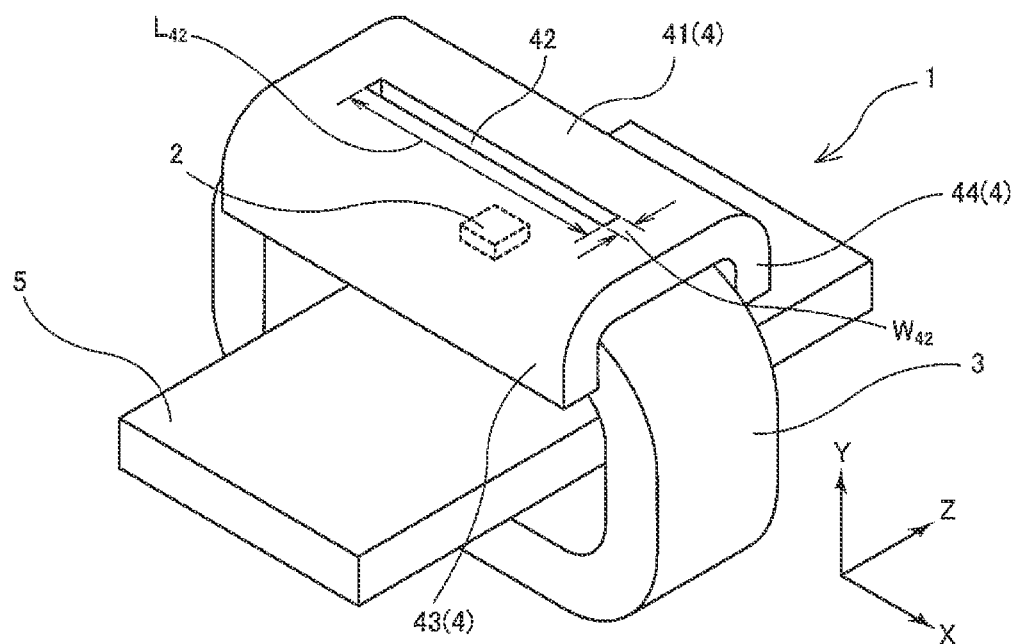
FIG. 18A is a perspective view showing the schematic configuration of a modified example of the second aspect of the current sensor according to the embodiment of the present invention.

In the aspect shown in FIG. 18A, the length $L_{42}$ in the lengthwise direction (X direction) of the slit section 42 may be shorter than or may be longer than the length $L_{CG}$; of the core gap CG in the X direction or may be the same as the length $L_{CG}$. In the aspect shown in FIGS. 18A~18D, the length $W_{42}$ of the slit section 42 in the short direction can be, for example, about 1~4 mm, and preferably about 2~3 mm. When the length $W_{42}$ is less than 1 mm, the effect of dispersing the disturbance magnetic field $H_Y$ by the slit section 42 is reduced, and there is a concern that the disturbance magnetic field $H_Y$ transmitted through the plate-shaped shield portion 41 of the magnetic shield 4 in the thickness direction will be applied to the magnetic detection unit 2. Furthermore, when the length $W_{42}$ exceeds 4 mm, there is a concern that the disturbance magnetic field $H_Y$ in the Y direction may pass through the slit section 42 and be applied to the magnetic detection unit 2.

In the second aspect of the current sensor 1 according to the present embodiment having the above-described configuration, by having the magnetic shield 4 include the first shield portion 43 and the second shield portion 44 that are continuous to both end portions 41A and 41B of the plate-shaped shield portion 41, the disturbance magnetic field $H_Y$ in the Y direction can be induced on the first shield portion 43 and the second shield portion 44. Furthermore, the disturbance magnetic field $H_X$ in the X direction is induced on the plate-shaped shield portion 41 of the magnetic shield 4 and the magnetization core 3. Hence, with the second aspect of the current sensor 1, it is possible to prevent the occurrence of detection errors due to the disturbance magnetic field $H_X$ in the X direction and the disturbance magnetic field $H_Y$ in the Y direction.

Figure 20:
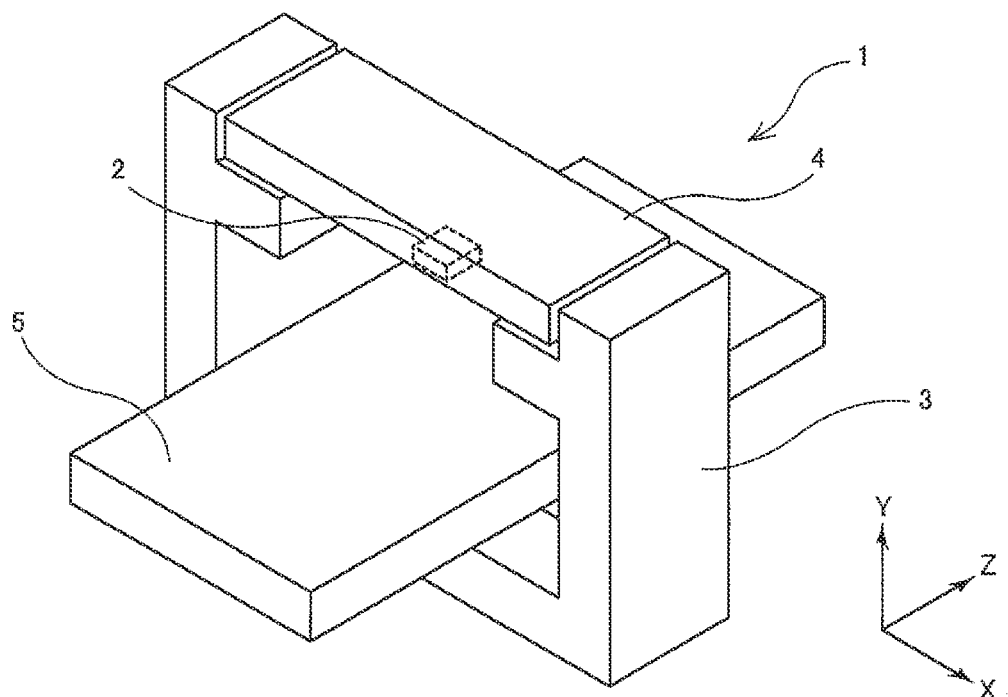
FIG. 20 is a perspective view showing the schematic configuration of a third aspect of the current sensor according to the embodiment of the present invention.
Figure 21:
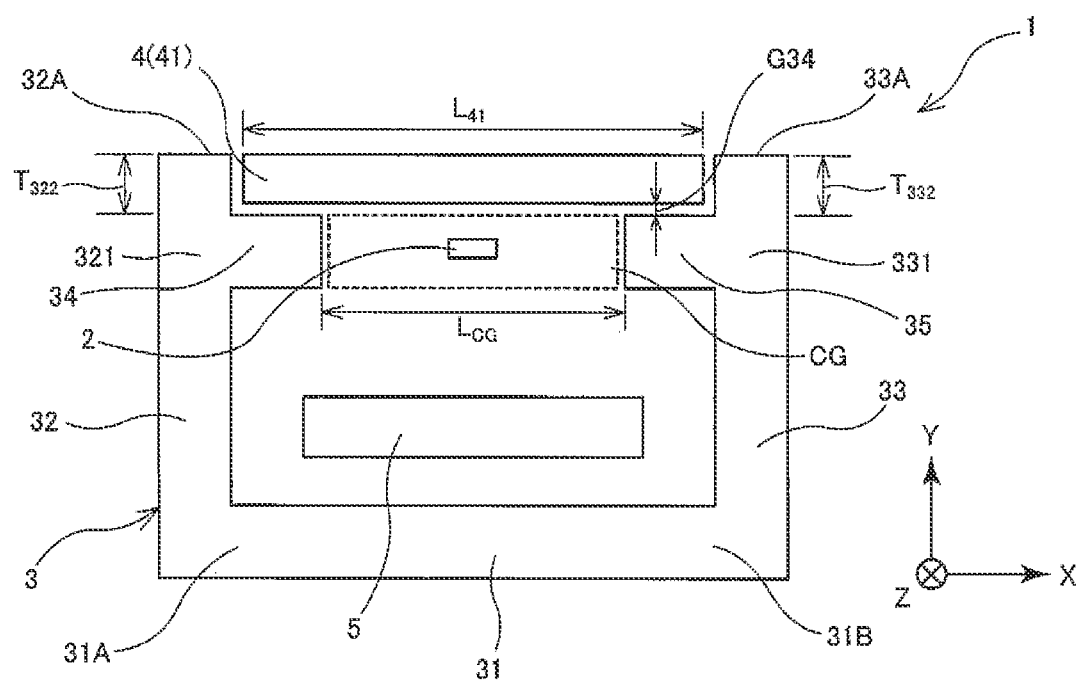
FIG. 21 is a side view showing the schematic configuration of the third aspect of the current sensor according to the embodiment of the present invention.
Figure 22:
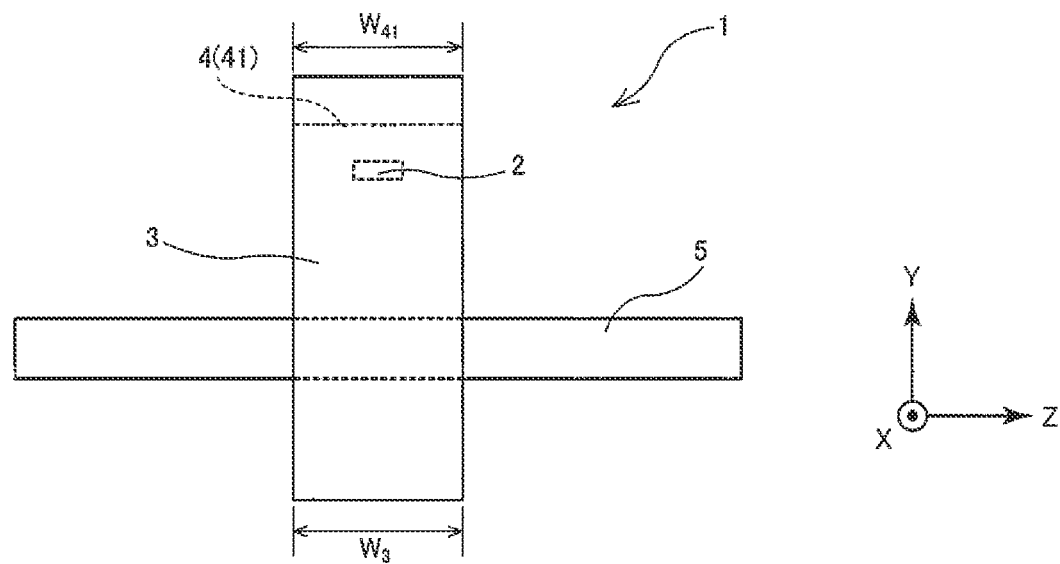
FIG. 22 is a side view showing the schematic configuration of the third aspect of the current sensor according to the embodiment of the present invention.

A third aspect of the current sensor 1 according to the present embodiment will be described. The same reference numerals are given to the same configurations as those in the first and second aspects, and detailed description thereof will be omitted. As shown in FIGS. 20~22, the third aspect of the current sensor 1 is provided with a magnetic detection unit 2 capable of detecting magnetism, a magnetization core 3, a magnetic shield 4, and a conductor 5 through which a current flows in the Z direction.

The magnetization core 3 includes a first core section 31, a second core section 32 and a third core section 33 continuous with both end portions 31A and 31B of the first core section 31, a fourth core section 34 which extends along the X direction and is continuous with a predetermined position 321 of the second core section 32 in the Y direction, and a fifth core section 35 which extends along the X direction and is continuous with a predetermined position 331 of the third core section 33 in the Y direction. The second core section 32 further extends in the Y direction from the continuous portion 321 with the fourth core section 34, and the third core section 33 further extends in the Y direction from the continuous portion 331 with the fifth core section 35. That is, the fourth core section 34 is not continuous with the end portion 32A of the second core section 32, and the fifth core section 35 is not continuous with the end portion 33A of the third core section 33. The fourth core section 34 and the fifth core section 35 extend along the X direction so that end faces thereof are close to each other. The gap (space) sandwiched between the end face of the fourth core section 34 and the end face of the fifth core section 35 is the core gap CG.

In the third aspect of the current sensor 1 according to the present embodiment, by having the second core section 32 extend along the Y direction from the continuous portion 321 of the second core section 32 with the fourth core section 34, and having the third core section 33 extend along the Y direction from the continuous portion 331 with the fifth core section 35 in the third core section 33, it is possible to cause the disturbance magnetic field $H_X$ in the X direction to be induced on the first core section 31 side of the magnetization core 3, and on the end portion 32A side of the second core section 32 or the end portion 33A side of the third core section 33, and it is possible to prevent the influence of the disturbance magnetic field $H_X$.

In the present embodiment, the continuous portion between the end portion 31A of the first core section 31 and the second core section 32 of the magnetization core 3, the continuous portion between the end portion 31B of the first core section 31 and the third core section 33, the continuous portion 321 of the second core section 32 and the fourth core section 34, and the continuous portion 331 between the third core section 33 and the fifth core section 35 all have a bent shape (a shape having corners), but this is intended to be illustrative and not limiting. For example, these continuous portions may have a curved shape (rounded shape) or a chamfered C shape with chamfered corners.

When the magnetization core 3 is positioned so that the first core section 31 extends downward and the second core section 32 and the third core section 33 extend upward from both end portions 31A and 31B of the first core section 31, the plate-shaped shield portion 41 of the magnetic shield 4 is arranged above the fourth core section 34 and the fifth core section 35 to be sandwiched between the second core section 32 and the third core section 33 in the X direction. In the third aspect of the current sensor 1 having such a configuration, the length $T_{322}$ along the Y direction to the end portion 32A from the continuous portion 321 of the fourth core section 34 in the second core section 32 and the length $T_{332}$ along the Y direction to the end portion 33A from the continuous portion 331 of the fifth core section 35 in the third core section are not particularly limited. For example, the lengths $T_{322}$ and $T_{332}$ may be such that the end portion 32A of the second core section 32 and the end portion 33A of the third core section 33 protrude upward more than the plate-shaped shield portion 41, or the length may be such that the plate-shaped shield portion 41 protrudes upward more than the end portion 32A of the second core section 32 and the end portion 33A of the third core section 33. Furthermore, the lengths $T_{322}$ and $T_{332}$ may be such that the upper surface of the plate-shaped shield portion 41 and both end portions 32A and 33A are positioned on the same plane (the XZ plane).

The length $G_{34}$ of the gap between the magnetic shield 4 (plate-shaped shield portion 41) and the magnetization core 3 (fourth core section 34 and fifth core section 35) in the Y direction can be, for example, 3 mm or less, and can be about 1~2 mm. When the length $G_{34}$ of the gap exceeds 3 mm, the disturbance magnetic field $H_Y$ in the Y direction may wrap around from the outside of the end face of the magnetic shield 4 in the Z direction toward the magnetic detection unit 2 and be applied to the magnetic detection unit 2. Furthermore, if the length $G_{34}$ of the gap is relatively short (for example, less than 1 mm), a magnetic path is formed from the magnetization core 3 through the magnetic shield 4 and magnetic flux easily flows to the magnetic shield 4, so the magnetization core 3 readily becomes magnetically saturated and there is a concern that the magnetic flux to be detected by the magnetic detection unit 2 may decrease.

In the present embodiment, the magnetic shield 4 is arranged so that the plate-shaped shield portion 41 completely overlaps the core gap CG when viewed along the Y direction. That is, the length $L_{41}$ in the X direction and the length $W_{41}$ in the Z direction of the plate-shaped shield portion 41 of the magnetic shield 4 can be at least as great as the length $L_{CG}$ in the X direction and the length in the Z direction of the core gap CG, that is, at least as great as the width $W_3$ of the magnetization core 3 in the Z direction. For example, the length $L_{41}$ of the plate-shaped shield portion 41 in the X direction can be at least the length $L_{CG}$ of the core cap CG in the X direction plus 4 mm and not more than the length $L_3$ of the magnetization core in the X direction, and the length $W_{41}$ in the Z direction can be at least as great as the width $W_3$ of the magnetization core 3 in the Z direction and can be about the width $W_3$ of the magnetization core 3 in the Z direction plus 8 mm. The third aspect of the current sensor 1 according to the present embodiment is not limited to this aspect. For example, the plate-shaped shield portion 41 does not have to completely overlap the core gap CG as long as the magnetic shield 4 can prevent the disturbance magnetic field $H_Y$ in the Y direction from being applied to the magnetic detection unit 2.

In the third aspect of the current sensor 1 according to the present embodiment, as shown in FIGS. 23A~23D, a slit section 42 penetrating in the Y direction may be formed in the plate-shaped shield portion 41 of the magnetic shield 4. The slit section 42 may be formed so that the lengthwise direction thereof is substantially parallel to the X direction (see FIG. 23A), may be formed so that the lengthwise direction thereof is substantially parallel to the Z direction (see FIGS. 23B and 23C), or may be formed so that the lengthwise direction thereof intersects the X and Z directions (see FIG. 23D). One slit section 42 may be formed in the plate-shaped shield portion 41 of the magnetic shield 4 (see FIGS. 23A, 23B and 23D), or a plurality of slit sections 42 may be formed (see FIG. 23C). The slit section 42 may be formed to overlap the magnetic detection unit 2 when viewed along the Y direction, that is, so that at least a part of the magnetic detection unit 2 is exposed from the slit section 42 (see FIGS. 23A, 23B and 23D), or may be formed to not overlap the magnetic detection unit 2 (see FIG. 23C).

In the third aspect of the current sensor 1 according to the present embodiment, when the slit section 42 is not formed in the plate-shaped shield portion 41 of the magnetic shield 4, a part of the disturbance magnetic field $H_Y$ in the Y direction penetrates in the thickness direction of the shield portion 41 of the magnetic shield 4 (see FIG. 12A). As a result, the current sensor 1 may be affected by the disturbance magnetic field $H_Y$.

On the other hand, by having the slit section 42 formed in the plate-shaped shield portion 41, the disturbance magnetic field $H_Y$ in the Y direction can be dispersed to both sides of the slit section 42 (in the short direction (Z direction) of the slit section 42 when viewed along the Y direction). Consequently, when the slit section 42 is formed to overlap the magnetic detection unit 2 when viewed along the Y direction, it is possible to effectively prevent the disturbance magnetic field $H_Y$ toward the magnetic detection unit 2 along the Y direction from being applied to the magnetic detection unit 2 (see FIG. 12B).

If the slit section 42 is formed so as not to overlap the magnetic detection unit 2 when viewed along the Y direction, it is possible to prevent the disturbance magnetic field wraps $H_Y$ that wraps around from the outside of the magnetic shield 4 and is induced on the magnetic shield 4 from affecting the current sensor 1 (see FIG. 12C).

Figure 23A:
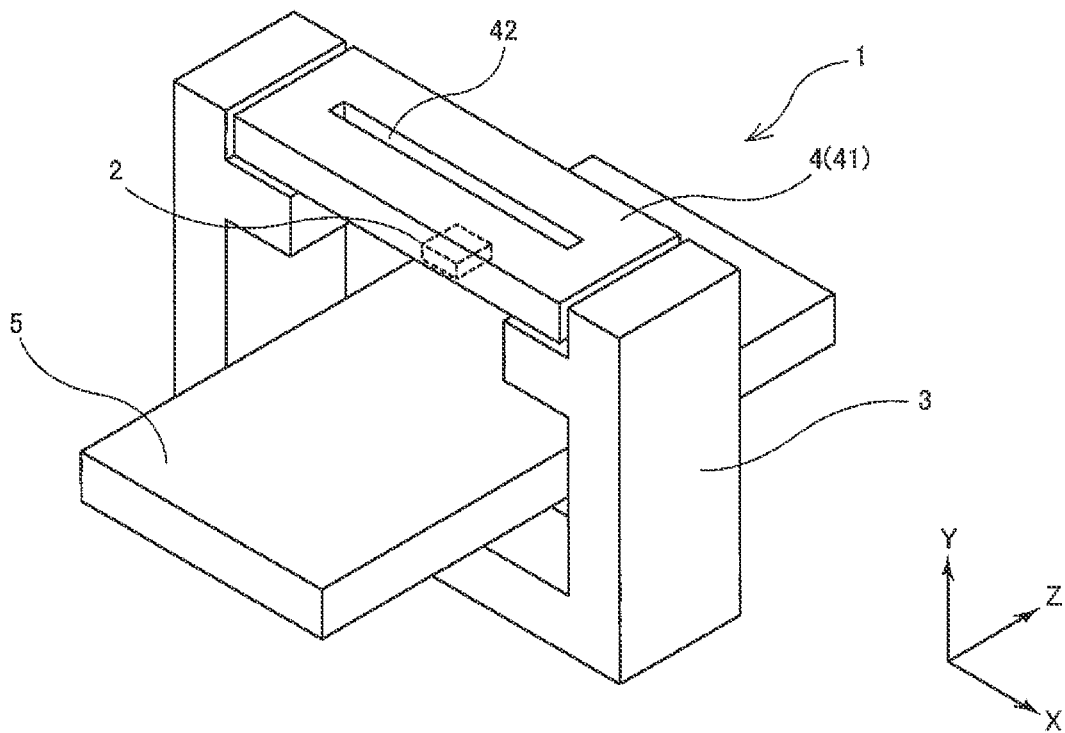
FIG. 23A is a perspective view showing the schematic configuration of a modified example of the third aspect of the current sensor according to the embodiment of the present invention.
Figure 23B:
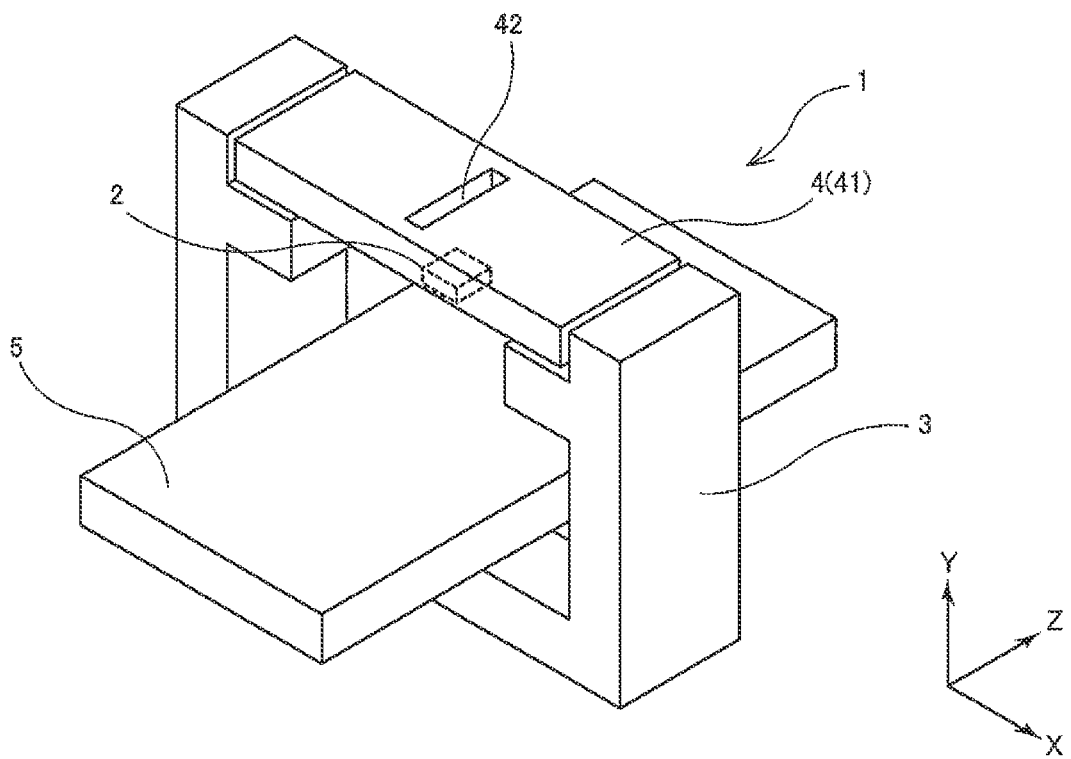
FIG. 23B is a perspective view showing the schematic configuration of a modified example of the third aspect of the current sensor according to the embodiment of the present invention.
Figure 23C:
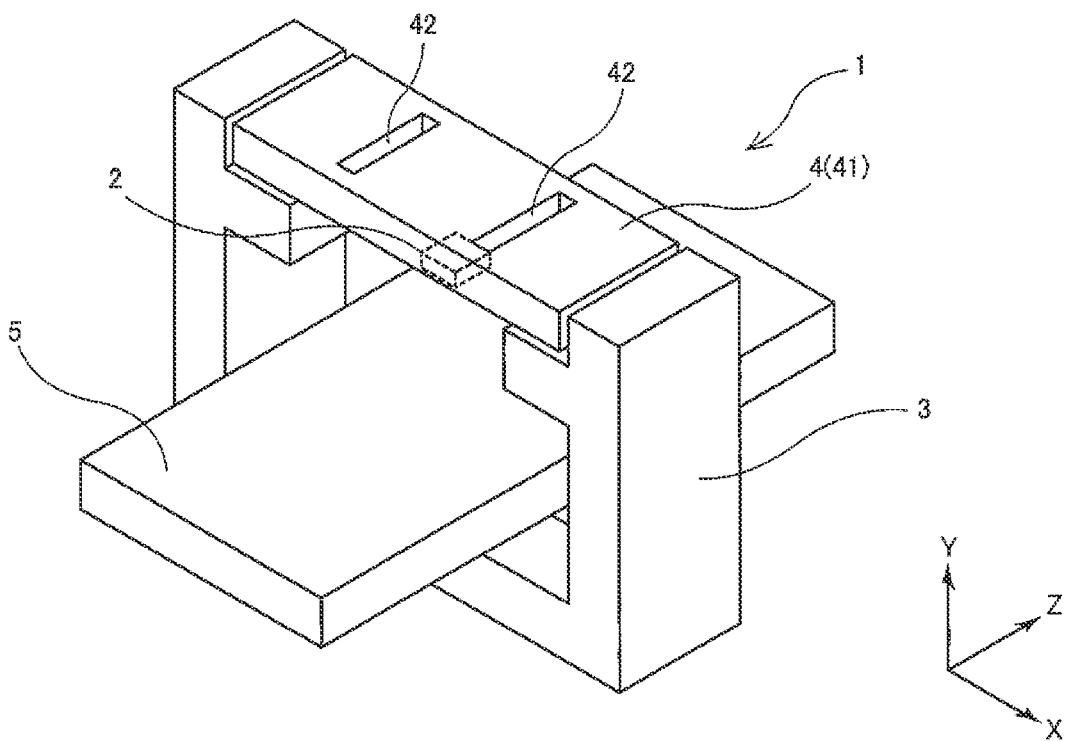
FIG. 23C is a perspective view showing the schematic configuration of a modified example of the third aspect of the current sensor according to the embodiment of the present invention.
Figure 23D:
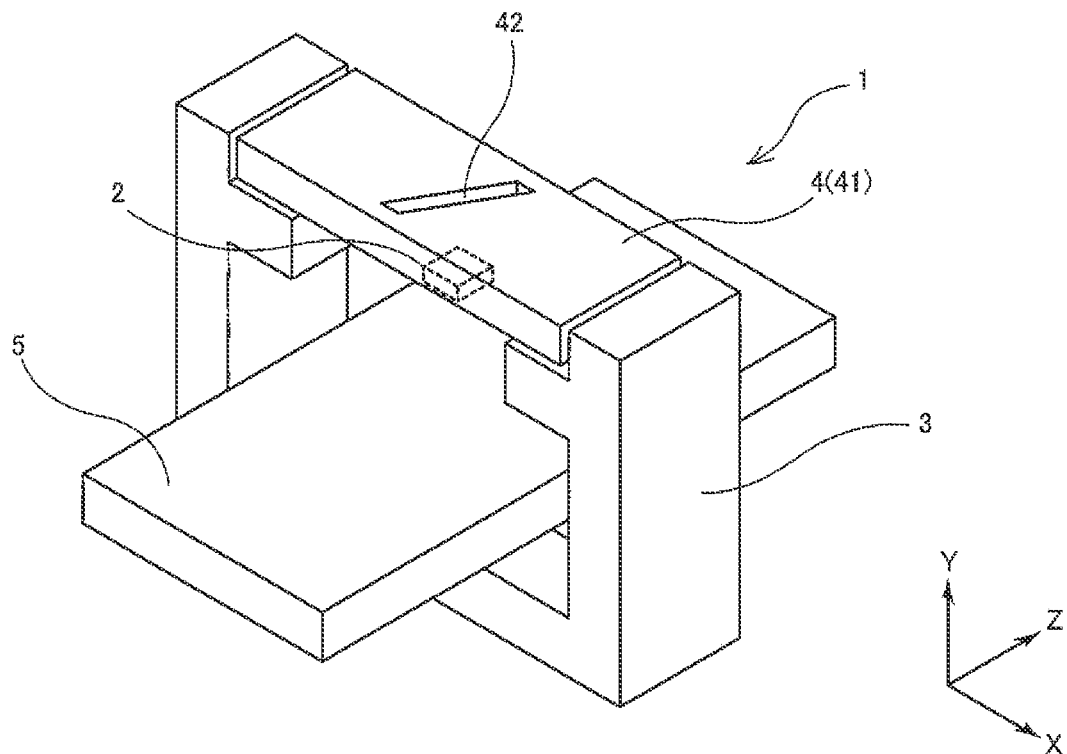
FIG. 23D is a perspective view showing the schematic configuration of a modified example of the third aspect of the current sensor according to the embodiment of the present invention.

In the aspect shown in FIG. 23A, the length $L_{42}$ of the slit section 42 in the lengthwise direction (X direction) may be shorter than or longer than the length $L_{CG}$ of the core cap in the X direction or may be the same as the length $L_{CG}$. In the embodiment shown in FIGS. 23A~23D, the length $W_{42}$ of the slit section 42 in the short direction can be, for example, about 1~4 mm, and preferably about 2~3 mm. When the length $W_{42}$ is less than 1 mm, the effect of dispersing the disturbance magnetic field $H_Y$ by the slit section 42 is reduced, and there is a concern that the disturbance magnetic field $H_Y$ transmitted through the plate-shaped shield portion 41 of the magnetic shield 4 in the thickness direction may be applied to the magnetic detection unit 2. Furthermore, when the length $W_{42}$ exceeds 4 mm, the disturbance magnetic field $H_Y$ in the Y direction may pass through the slit section 42 and be applied to the magnetic detection unit 2.

According to the third aspect of the current sensor 1 having the above-described configuration, it is possible to prevent the influence of the disturbance magnetic field $H_X$ in the X direction and the disturbance magnetic field $H_Y$ in the Y direction, so that the current flowing through the conductor 5 can be detected with high accuracy.

Figure 24:
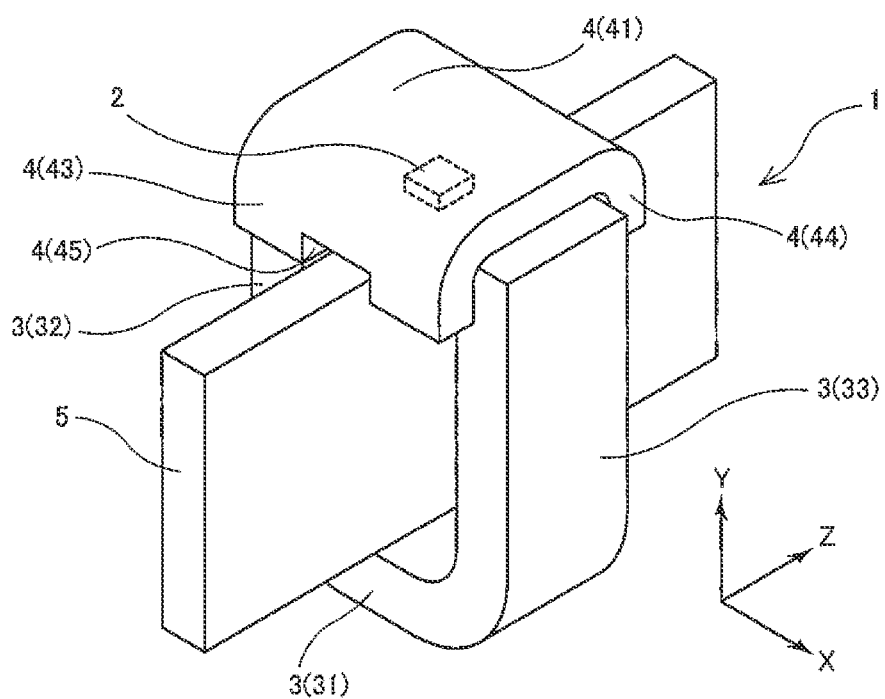
FIG. 24 is a perspective view showing the schematic configuration of a fourth aspect of the current sensor according to the embodiment of the present invention.
Figure 25:
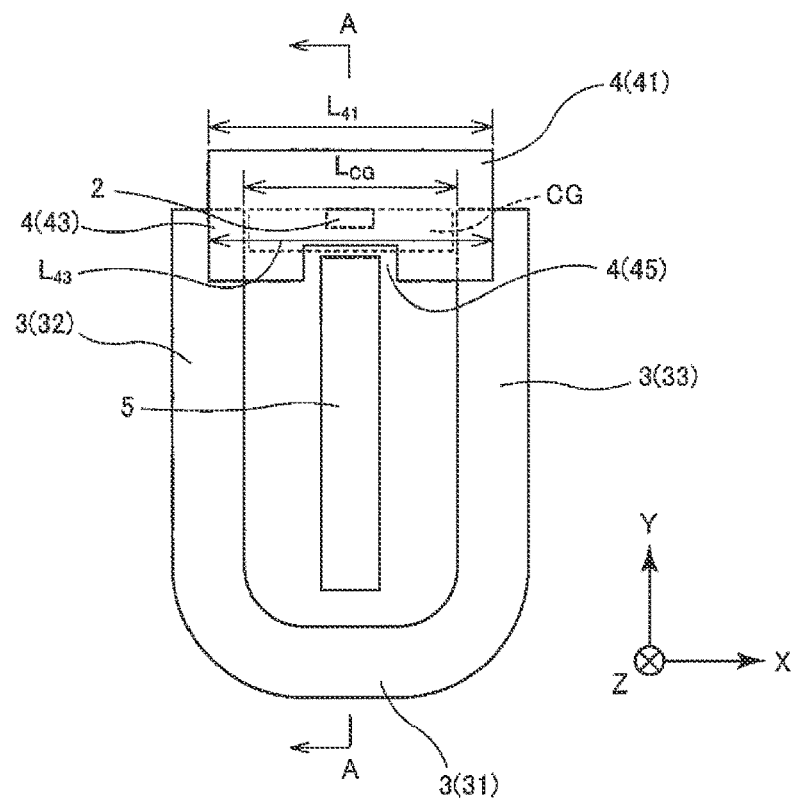
FIG. 25 is a side view showing the schematic configuration of the fourth aspect of the current sensor according to the embodiment of the present invention.
Figure 26:
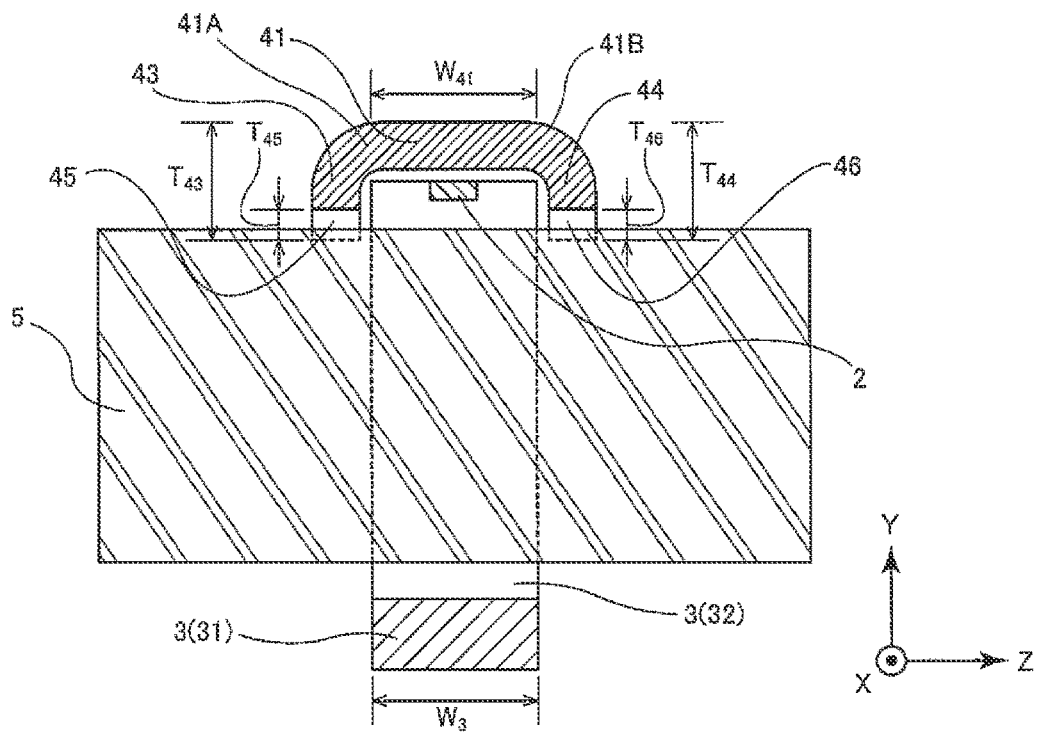
FIG. 26 is a side view showing the schematic configuration of the fourth aspect of the current sensor according to the embodiment of the present invention.

A fourth aspect of the current sensor 1 according to the present embodiment will be described. The same reference numerals are given to the same configurations as those in the first to third aspects, and detailed description thereof will be omitted. As shown in FIGS. 24~26, the fourth aspect of the current sensor 1 is provided with a magnetic detection unit 2 capable of detecting magnetism, a magnetization core 3, a magnetic shield 4, and a conductor 5 through which a current flows in the Z direction.

The magnetization core 3 has a first core section 31 substantially parallel to the Z direction, and a second core section 32 and a third core section 33 extending in the Y direction (+Y direction) and continuous with both end portions 31A and 31B of the first core section 31 in the X direction. A gap (space) sandwiched between the vicinity of the end of the second core section 32 and the vicinity of the end of the third core section 33 facing each other in the X direction is the core gap CG. That is, the magnetization core 3 has a core gap CG and is a substantially U-shaped core when viewed along the Z direction. In the fourth aspect, the magnetic flux generated from the conductor 5 and focused on the magnetization core 3 exits from the end of the second core section 32 or the end of the third core section 33 and is absorbed by the end of the third core section 33 or the end of the second core section 32, but "the vicinity of the end of the second core section 32" and "the vicinity of the end of the third core section 33" can be defined as the region where the above-described magnetic flux exits at the end of the second core section 32 and the end of the third core section 33, or the region where the above-described magnetic flux is absorbed at the end of the second core section 32 and the end of the third core section 33. The region where this magnetic flux exits or is absorbed can be found by magnetic simulation, for example.

The length $L_{CG}$ of the core gap CG in the X direction (the distance in the X direction between the vicinity of the end of the second core section 32 and the vicinity of the end of the third core section 33) can be, for example, 6 mm or more, and can be about 6~12 mm. When the length $L_{CG}$ is 6 mm or more, the effect of the current sensor 1 according to the present embodiment being provided with the magnetic shield 4, that is, the effect of the magnetic shield 4 preventing the disturbance magnetic field from being applied to the magnetic detection unit 2, can be effectively achieved.

The magnetic shield 4 includes first shield portion 43 and a second shield portion 44 which extend along the Y direction and are continuous with both end portions 41A and 41B of the plate-shaped shield portion 41 in the Z direction. The length $L_{41}$ of the plate-shaped shield portion 41 in the X direction is the same as the length $L_{43}$ of the first shield portion 43 in the X direction and the length of the second shield portion 44 in the X direction. That is, the magnetic shield 4 substantially has a U-shape when viewed along the X direction.

In the fourth aspect of the current sensor 1 according to the present embodiment, the magnetic shield 4 includes a first shield portion 43 and a second shield portion 44 that are continuous with both end portions 41A and 41B of the plate-shaped shield portion 41 in the Z direction. The first shield portion 43 and the second shield portion 44 extend in the −Y direction from both end portions 41A and 41B of the plate-shaped shield portion 41. By having the magnetic shield 4 include the first shield portion 43 and the second shield portion 44, the disturbance magnetic field $H_Y$ in the Y direction is induced on the first shield portion 43 and the second shield portion 44 (see FIG. 17A), so it is possible to prevent the disturbance magnetic field $H_Y$ from being applied to the magnetic detection unit 2. Furthermore, since the disturbance magnetic field $H_X$ in the X direction is induced on the first shield portion 43 and the second shield portion 44 from the fourth core section 34 or the fifth core section 35 of the magnetization core 3 (see FIG. 17B), it is possible to prevent the disturbance magnetic field $H_X$ from being applied to the magnetic detection unit 2.

The first shield portion 43 and the second shield portion 44 have recesses 45 and 46 recessed in the +Y direction substantially in the center in the X direction. The lengths $L_{45}$ and $L_{46}$ of the recesses 45 and 46 in the X direction are not particularly limited but can be larger than the thickness of the conductor 5. In the fourth aspect of the current sensor 1, the conductor 5 is provided to extend in the Z direction with the thickness direction as the X direction. By arranging a part of the conductor 5 in the recesses 45 and 46, the effect of the first shield portion 43 and the second shield portion 44 in preventing the disturbance magnetic field $H_Y$ in the Y direction from being applied to the magnetic detection unit 2 can be accomplished without increasing the overall size of the current sensor 1.

The conductor 5 is provided to extend in the Z direction with its thickness direction as the X direction and its width direction as the Y direction. By having the conductor 5 arranged in this manner, the size of the current sensor 1 in the X direction can be made compact. On the other hand, when the conductor 5 is arranged in such a manner, the size of the current sensor 1 in the Y direction becomes large, but by having recesses 45 and 46 provided in the first shield portion 43 and the second shield portion 44 and arranging a part of the conductor 5 in the recesses 45 and 46, it is possible to prevent the size of the current sensor 1 from increasing in the Y direction.

In the fourth aspect of the current sensor 1 according to the present embodiment, as shown in FIGS. 27A~27D, a slit section 42 penetrating in the Y direction may be formed in the plate-shaped shield portion 41 of the magnetic shield 4. The slit section 42 may be formed so that the lengthwise direction thereof is substantially parallel to the X direction (see FIG. 27A) or may be formed so that the lengthwise direction thereof is substantially parallel to the Z direction (see FIGS. 27B and 27C) or may be formed so that the lengthwise direction thereof intersects the X direction and the Z direction (see FIG. 27D). In the plate-shaped shield portion 41 of the magnetic shield 4, one slit section 42 may be formed (see FIGS. 27A, 27B and 27D), or a plurality of slit sections 42 may be formed (see FIG. 27C). The slit section 42 may be formed to overlap the magnetic detection unit 2 when viewed along the Y direction, that is, at least a part of the magnetic detection unit 2 is exposed from the slit section 42 (see FIGS. 27A, 27B and 27D), or may be formed to not overlap the magnetic detection unit 2 (see FIG. 27C).

In the fourth aspect of the current sensor 1 according to the present embodiment, when the slit section 42 is not formed in the plate-shaped shield portion 41 of the magnetic shield 4, a part of the disturbance magnetic field $H_Y$ in the Y direction penetrates in the thickness direction of the shield portion 41 of the magnetic shield 4 (see FIG. 17A). As a result, there is a concern that the current sensor 1 may be affected by the disturbance magnetic field $H_Y$.

On the other hand, by having the slit section 42 formed in the plate-shaped shield portion 41, the disturbance magnetic field $H_Y$ in the Y direction can be dispersed to both sides of the slit section 42 (both sides in the short direction (the Z direction) of the slit section 42 when viewed along the Y direction). Hence, when the slit section 42 is formed to overlap the magnetic detection unit 2 when viewed along the Y direction, it is possible to effectively prevent the disturbance magnetic field $H_Y$ toward the magnetic detection unit 2 along the Y direction from being applied to the magnetic detection unit 2 (see FIG. 19).

When the slit section 42 is formed so as not to overlap the magnetic detection unit 2 when viewed along the Y direction, it is possible to prevent the disturbance magnetic field that wraps around from the outside of the magnetic shield 4 and is induced by the magnetic shield 4 from having an influence on the current sensor 1 (see FIG. 12C).

Figure 27A:
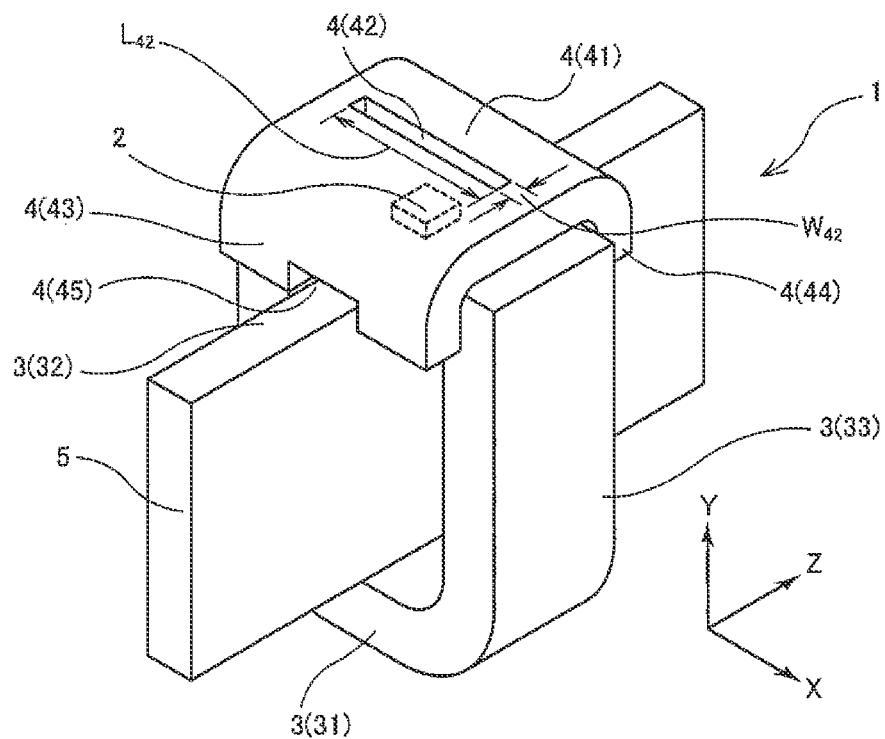
FIG. 27A is a perspective view showing the schematic configuration of a modified example of the fourth aspect of the current sensor according to the embodiment of the present invention.
Figure 27B:
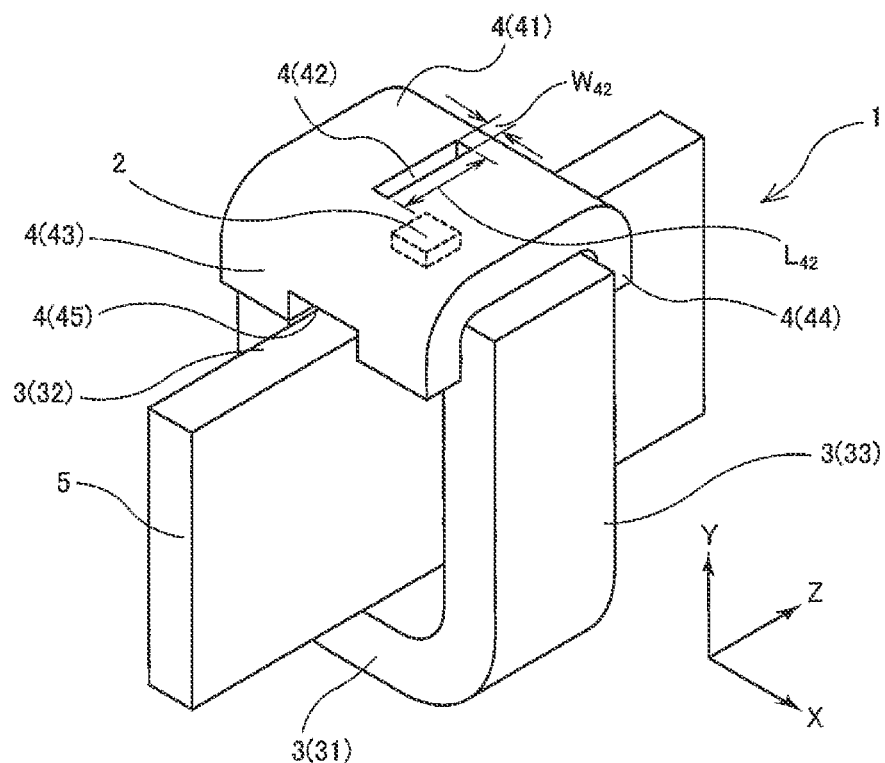
FIG. 27B is a perspective view showing the schematic configuration of a modified example of the fourth aspect of the current sensor according to the embodiment of the present invention.
Figure 27C:
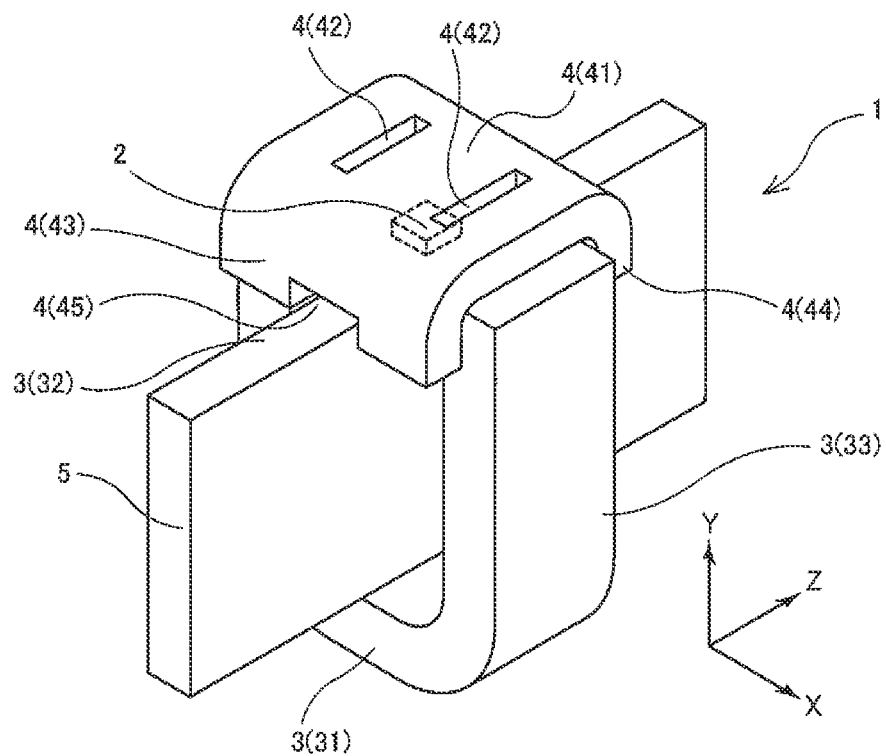
FIG. 27C is a perspective view showing the schematic configuration of a modified example of the fourth aspect of the current sensor according to the embodiment of the present invention.
Figure 27D:
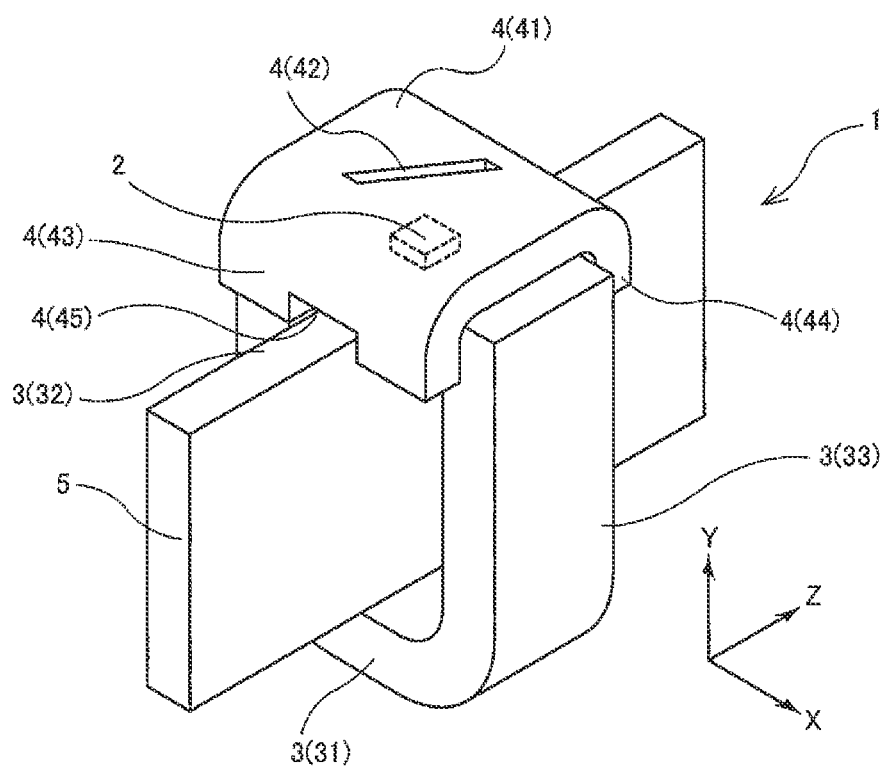
FIG. 27D is a perspective view showing the schematic configuration of a modified example of the fourth aspect of the current sensor according to the embodiment of the present invention.

In the aspect shown in FIG. 27A, the length $L_{42}$ in the lengthwise direction (X direction) of the slit section 42 may be shorter than or longer than the length $L_{CG}$ of the core gap CG in the X direction or may be the same as $L_{CG}$. In the aspect shown in FIGS. 27A~27D, the length $W_{42}$ of the slit section 42 in the short direction can be, for example, about 1~4 mm, and preferably about 2~3 mm. When the length $W_{42}$ is less than 1 mm, the effect of dispersing the disturbance magnetic field $H_Y$ by the slit section 42 is reduced, and there is a concern that the disturbance magnetic field $H_Y$ transmitted through the plate-shaped shield portion 41 of the magnetic shield 4 in the thickness direction could be applied to the magnetic detection unit 2. Furthermore, when the length $W_{42}$ exceeds 4 mm, there is a concern that the disturbance magnetic field $H_Y$ in the Y direction may pass through the slit section 42 and be applied to the magnetic detection unit 2.

With the fourth aspect of the current sensor 1 having the above-described configuration, it is possible to suppress the influence of the disturbance magnetic field $H_X$ in the X direction and the disturbance magnetic field $H_Y$ in the Y direction, so it is possible to detect the current flowing through the conductor 5 with high accuracy.

Figure 28:
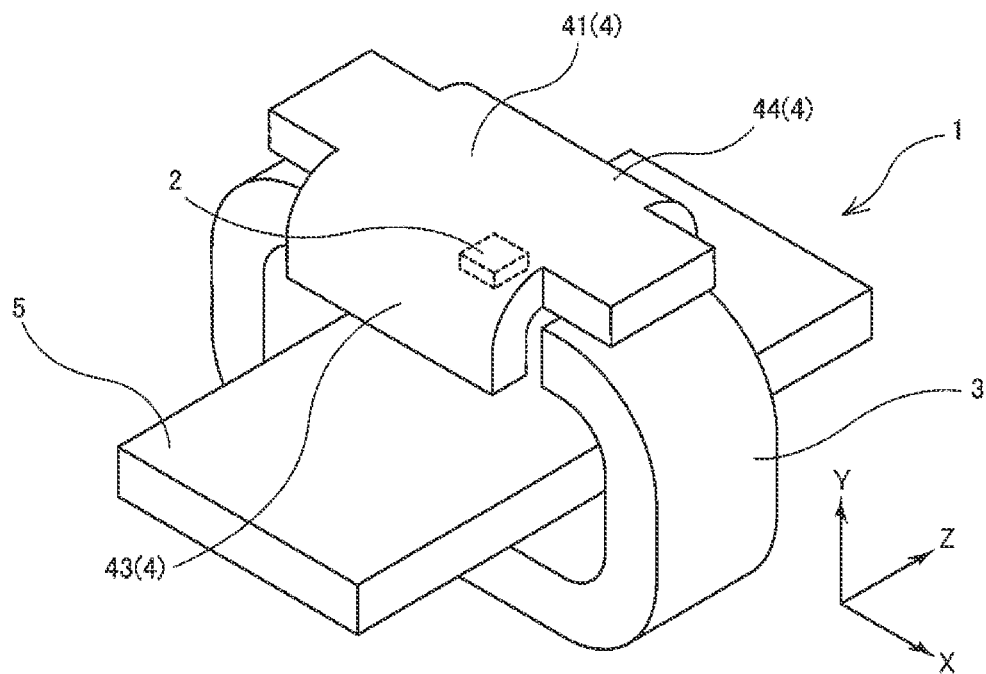
FIG. 28 is a perspective view showing the schematic configuration of a fifth aspect of the current sensor according to the embodiment of the present invention.
Figure 29:
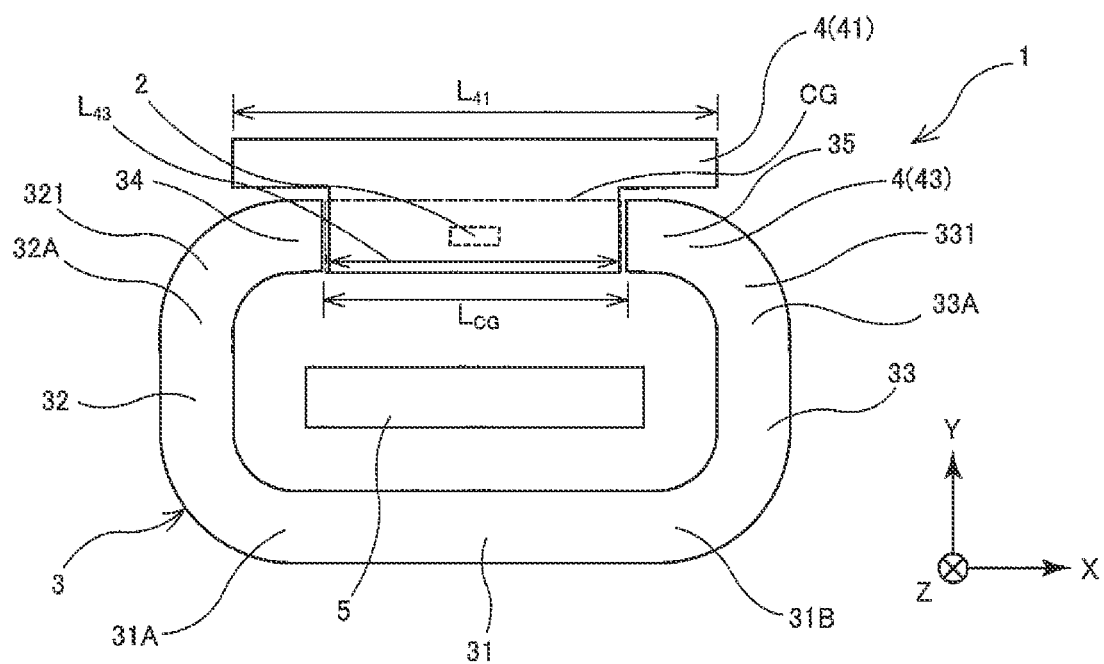
FIG. 29 is a side view showing the schematic configuration of the fifth aspect of the current sensor according to the embodiment of the present invention.
Figure 30:
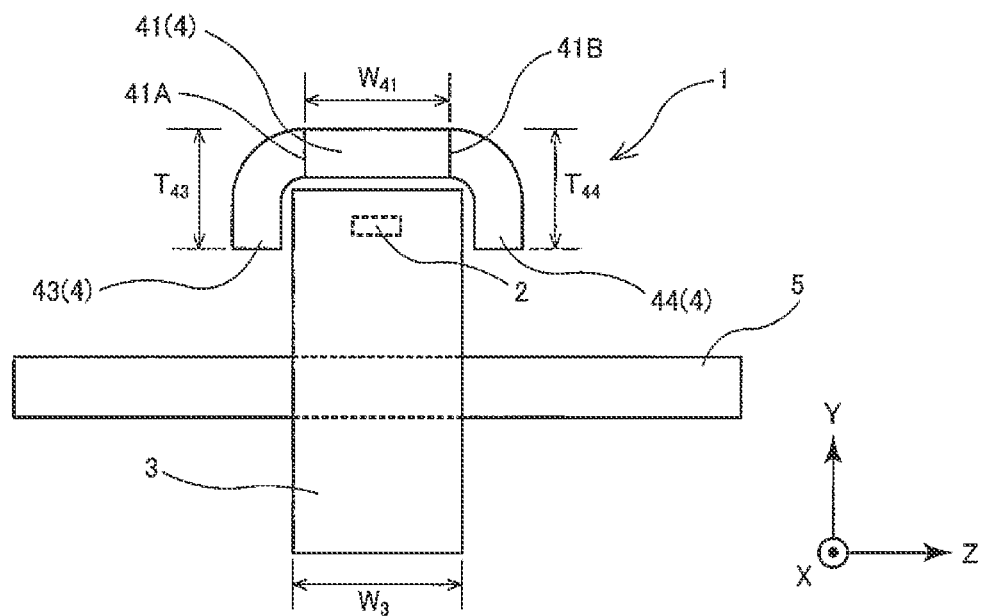
FIG. 30 is a side view showing the schematic configuration of the fifth aspect of the current sensor according to the embodiment of the present invention.

A fifth aspect of the current sensor 1 according to the present embodiment will be described. The same reference numerals are given to the same configurations as those in the first through fourth aspects, and detailed description thereof will be omitted. As shown in FIGS. 28~30, the fifth aspect of the current sensor 1 is provided with a magnetic detection unit 2 capable of detecting magnetism, a magnetization core 3, a magnetic shield 4, and a conductor 5 through which a current flows in the Z direction.

In the fifth aspect of the current sensor 1 according to the present embodiment, the magnetic shield 4 includes a first shield portion 43 and a second shield portion 44 that are continuous with both end portions 41A and 41B of the plate-shaped shield portion 41 in the Z direction. The first shield portion 43 and the second shield portion 44 extend in the −Y direction from both end portions 41A and 41B of the plate-shaped shield portion 41. By having the magnetic shield 4 include the first shield portion 43 and the second shield portion 44, the disturbance magnetic field $H_Y$ in the Y direction is induced on the first shield portion 43 and the second shield portion 44 (see FIG. 17A), so it is possible to prevent the disturbance magnetic field $H_Y$ from being applied to the magnetic detection unit 2. Furthermore, since the disturbance magnetic field $H_X$ in the X direction is induced on the first shield portion 43 and the second shield portion 44 from the fourth core section 34 or the fifth core section 35 of the magnetization core 3 (see FIG. 17B), it is possible to prevent the disturbance magnetic field $H_X$ from being applied to the magnetic detection unit 2.

The length $L_{41}$ of the plate-shaped shield portion 41 in the X direction is longer than the length $L_{43}$ of the first shield portion 43 in the X direction and the length of the second shield portion 44 in the X direction. The length $L_{43}$ of the first shield portion 43 in the X direction and the length of the second shield portion 44 in the X direction may be the same as the length $L_{CG}$ of the core gap CG in the X direction or may be longer or shorter than the length $L_{CG}$.

In the fifth aspect of the current sensor 1 according to the present embodiment, as shown in FIGS. 31A to 31D, a slit section 42 penetrating in the Y direction may be formed in the plate-shaped shield portion 41 of the magnetic shield 4. The slit section 42 may be formed so that the lengthwise direction thereof is substantially parallel to the X direction (see FIG. 31A) or may be formed so that the lengthwise direction thereof is substantially parallel to the Z direction (see FIGS. 31B and 31C) or may be formed so that the lengthwise direction thereof intersects the X direction and the Z direction (see FIG. 31D). In the plate-shaped shield portion 41 of the magnetic shield 4, one slit section 42 may be formed (see FIGS. 31A, 31B and 31D), or a plurality of slit sections 42 may be formed (see FIG. 31C). The slit section 42 may be formed to overlap the magnetic detection unit 2 when viewed along the Y direction, that is, so that at least a part of the magnetic detection unit 2 is exposed from the slit section 42 (see FIGS. 31A, 31B and 31D), or may be formed to not overlap the magnetic detection unit 2 (see FIG. 31C).

In the fifth aspect of the current sensor 1 according to the present embodiment, when the slit section 42 is not formed in the plate-shaped shield portion 41 of the magnetic shield 4, a part of the disturbance magnetic field $H_Y$ in the Y direction penetrates in the thickness direction of the shield portion 41 of the magnetic shield 4 (see FIG. 17A). As a result, the current sensor 1 may be affected by the disturbance magnetic field $H_Y$.

On the other hand, by having the slit section 42 formed in the plate-shaped shield portion 41, it is possible to disperse the disturbance magnetic field $H_Y$ in the Y direction to both sides of the slit section 42 (both sides in the short direction (the Z direction) of the slit section 42 when viewed along the Y direction). Therefore, when the slit section 42 is formed to overlap the magnetic detection unit 2 when viewed along the Y direction, it is possible to effectively prevent the disturbance magnetic field $H_Y$ toward the magnetic detection unit 2 along the Y direction from being applied to the magnetic detection unit 2 (see FIG. 19).

When the slit section 42 is formed so as not to overlap the magnetic detection unit 2 when viewed along the Y direction, it is possible to prevent the disturbance magnetic field that wraps around from the outside of the magnetic shield 4 and is induced by the magnetic shield 4 from having an influence on the current sensor 1 (see FIG. 12C).

Figure 31A:
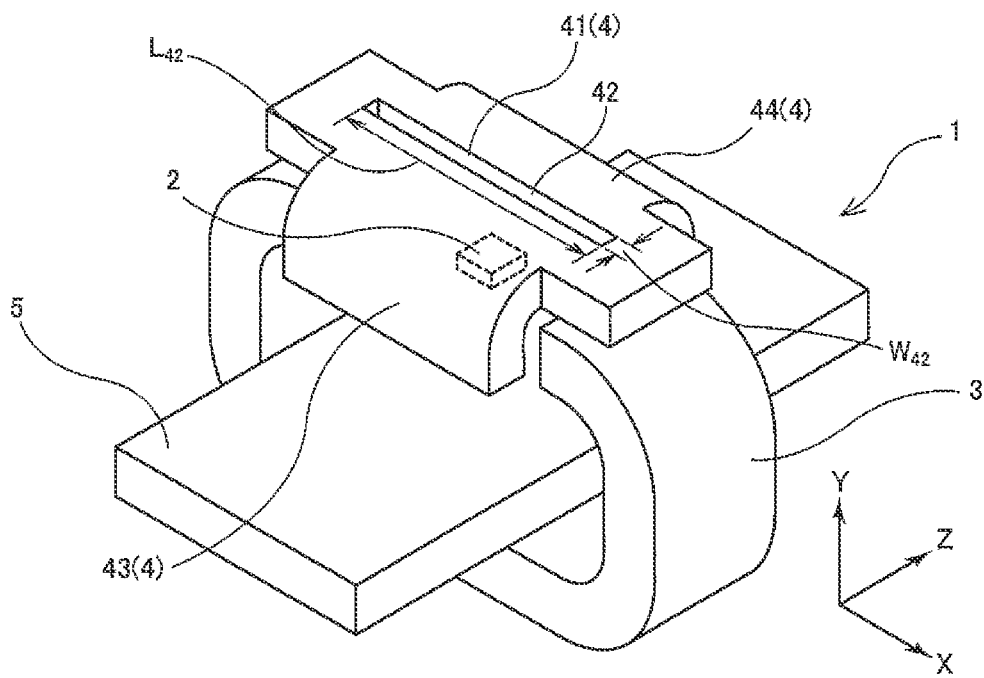
FIG. 31A is a perspective view showing the schematic configuration of a modified example of the fifth aspect of the current sensor according to the embodiment of the present invention.
Figure 31B:
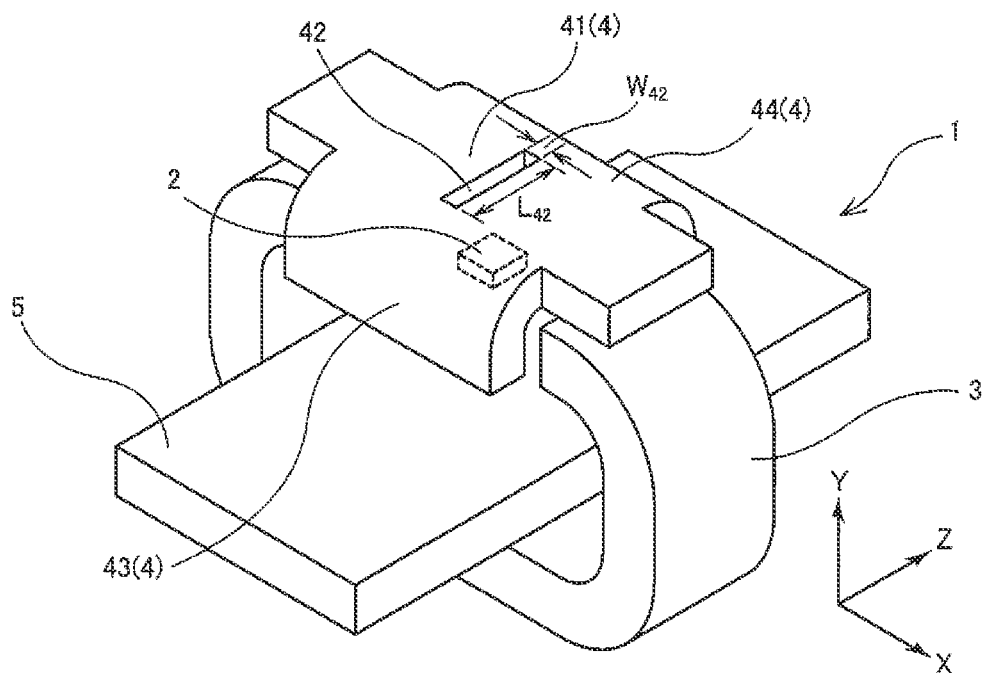
FIG. 31B is a perspective view showing the schematic configuration of a modified example of the fifth aspect of the current sensor according to the embodiment of the present invention.
Figure 31C:
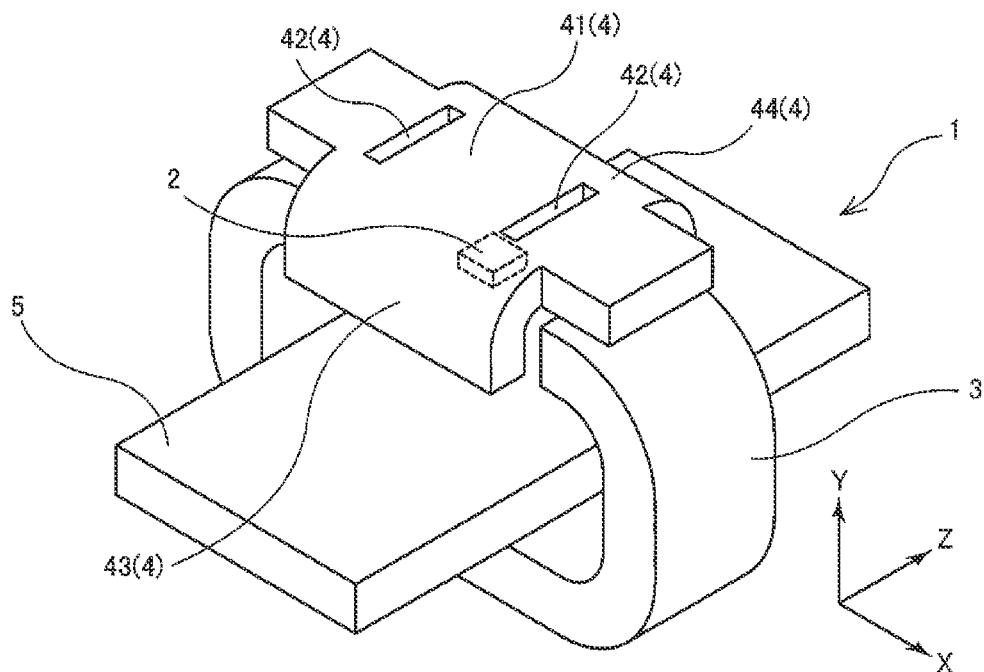
FIG. 31C is a perspective view showing the schematic configuration of a modified example of the fifth aspect of the current sensor according to the embodiment of the present invention.
Figure 31D:
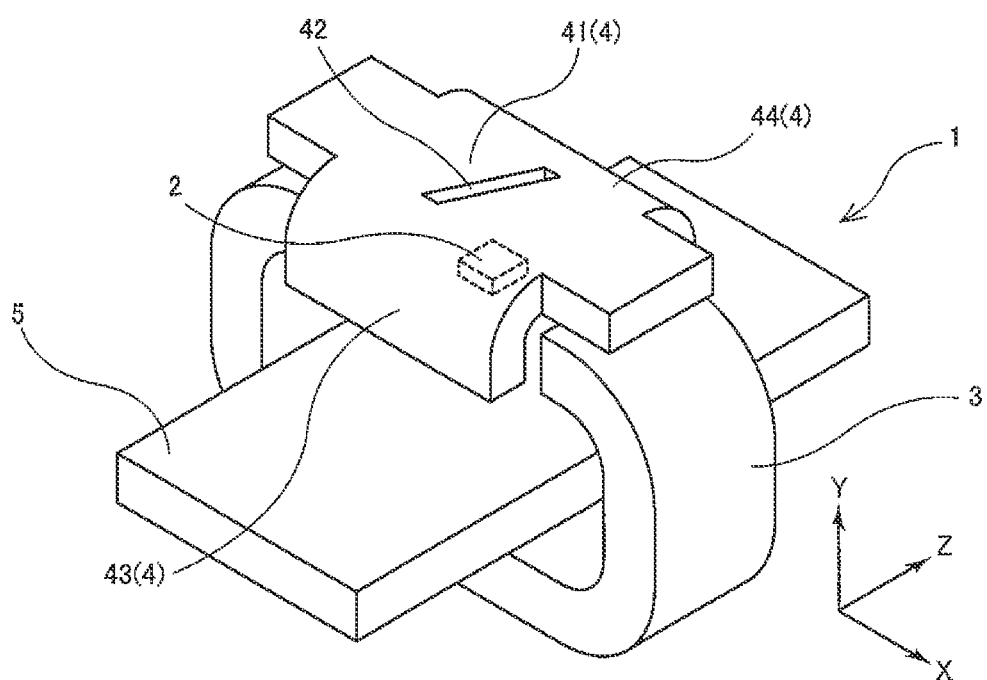
FIG. 31D is a perspective view showing the schematic configuration of a modified example of the fifth aspect of the current sensor according to the embodiment of the present invention.

In the aspect shown in FIG. 31A, the length $L_{42}$ in the lengthwise direction (X direction) of the slit section 42 may be shorter than or longer than the length $L_{CG}$ of the core gap CG in the X direction or may be the same as $L_{CG}$. In the aspect shown in FIGS. 31A~31D, the length $W_{42}$ of the slit section 42 in the short direction can be, for example, about 1~4 mm, and preferably about 2~3 mm. When the length Wu is less than 1 mm, the effect of dispersing the disturbance magnetic field $H_Y$ by the slit section 42 is reduced, and there is a concern that the disturbance magnetic field $H_Y$ transmitted through the plate-shaped shield portion 41 of the magnetic shield 4 in the thickness direction could be applied to the magnetic detection unit 2. Furthermore, when the length $W_{42}$ exceeds 4 mm, there is a concern that the disturbance magnetic field $H_Y$ in the Y direction may pass through the slit section 42 and be applied to the magnetic detection unit 2.

According to the fifth aspect of the current sensor 1 having the above-described configuration, it is possible to suppress the influence of the disturbance magnetic field $H_X$ in the X direction and the disturbance magnetic field $H_Y$ in the Y direction, so that the current flowing through the conductor 5 can be detected with high accuracy.

The current sensor 1 according to the present embodiment having the above-described configuration can be provided in an electric control device. Examples of electric control device in the present embodiment include a battery management system in a hybrid electric vehicle (HEV) or an electric vehicle (EV) or the like, an inverter, a converter, or the like. The current sensor 1 according to the present embodiment is used for measuring an input/output current from a power source and outputting information on the measured current to an electric control device or the like.

The embodiment described above was described to facilitate understanding of the present invention and was not described to limit the present invention. Therefore, each element disclosed in the above embodiment is intended to include all design changes and equivalents falling within the technical scope of the present invention.

In the third aspect of the current sensor 1 according to the above embodiment (see FIG. 20 and the like), the magnetic shield 4 may be continuous with both ends of the plate-shaped shield portion 41 in the Z direction and have a first shield portion and a second shield portion that extends along the Y direction.

Examples

Below, the present invention will be described in more detail by citing test examples, but the present invention is not limited to the below-described test examples.

Test Example 1 In the current sensor 1 having the structure shown in FIG. 1, an output signal from the current sensor 1 when the disturbance magnetic field $H_X$ in the X direction is 0 mT (millitesla) and an output signal from the current sensor 1 when the disturbance magnetic field $H_X$ in the X direction is 10 mT were each found through simulation, and the error (EX, %) of the output signal of the current sensor 1 caused by the disturbance magnetic field $H_X$ in the X direction was calculated (Sample 1). Similarly, an output signal from the current sensor 1 when the disturbance magnetic field $H_Y$ in the Y direction is 0 mT (millitesla) and an output signal from the current sensor 1 when the disturbance magnetic field Hi in the Y direction is 10 mT were each found through simulation, and the error (EY, %) of the output signal of the current sensor 1 caused by the disturbance magnetic field $H_Y$ in the Y direction was calculated (Sample 1). The simulation results are shown in Table 1.

Test Example 2 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 11A was used (Sample 2). The simulation results are shown in Table 1.

Test Example 3 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 23A was used (Sample 3). The simulation results are shown in Table 1.

Figure 13:
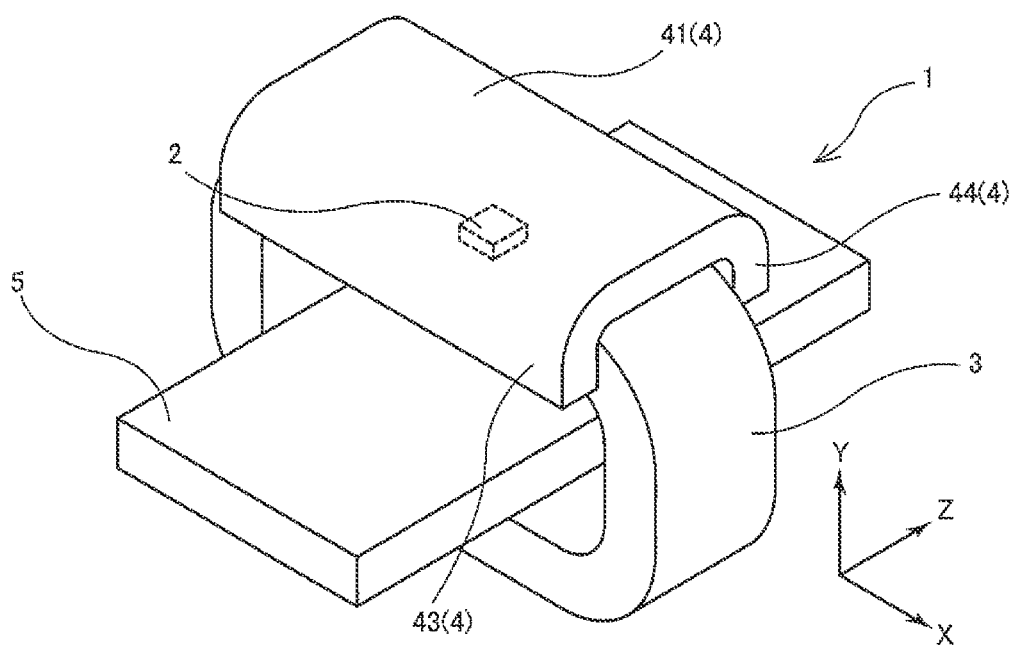
FIG. 13 is a perspective view showing the schematic configuration of a second aspect of the current sensor according to the embodiment of the present invention.
Figure 14:
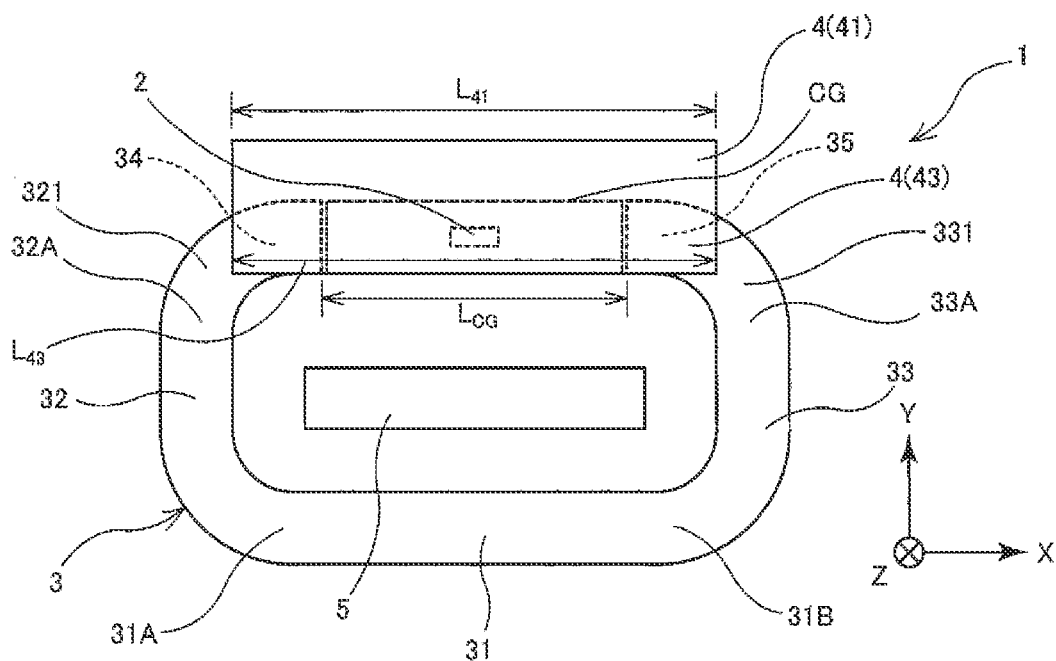
FIG. 14 is a side view showing the schematic configuration of the second aspect of the current sensor according to the embodiment of the present invention.
Figure 15:
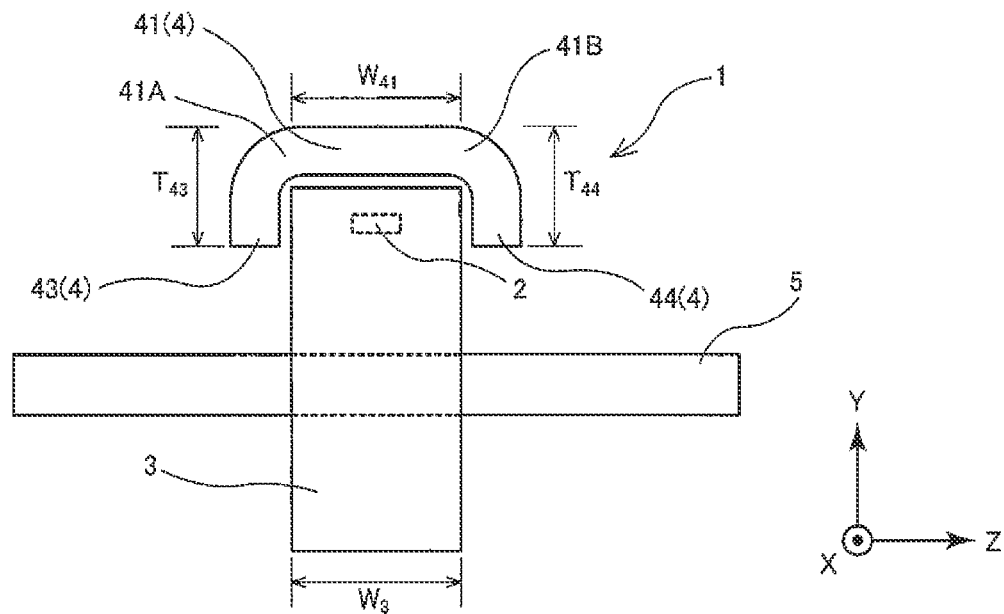
FIG. 15 is a side view showing the schematic configuration of the second aspect of the current sensor according to the embodiment of the present invention.

Test Example 4 The error (EX, Y) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 13 was used (Sample 4). The simulation results are shown in Table 1.

Test Example 5 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 18A was used (Sample 5). The simulation results are shown in Table 1.

Figure 18B:
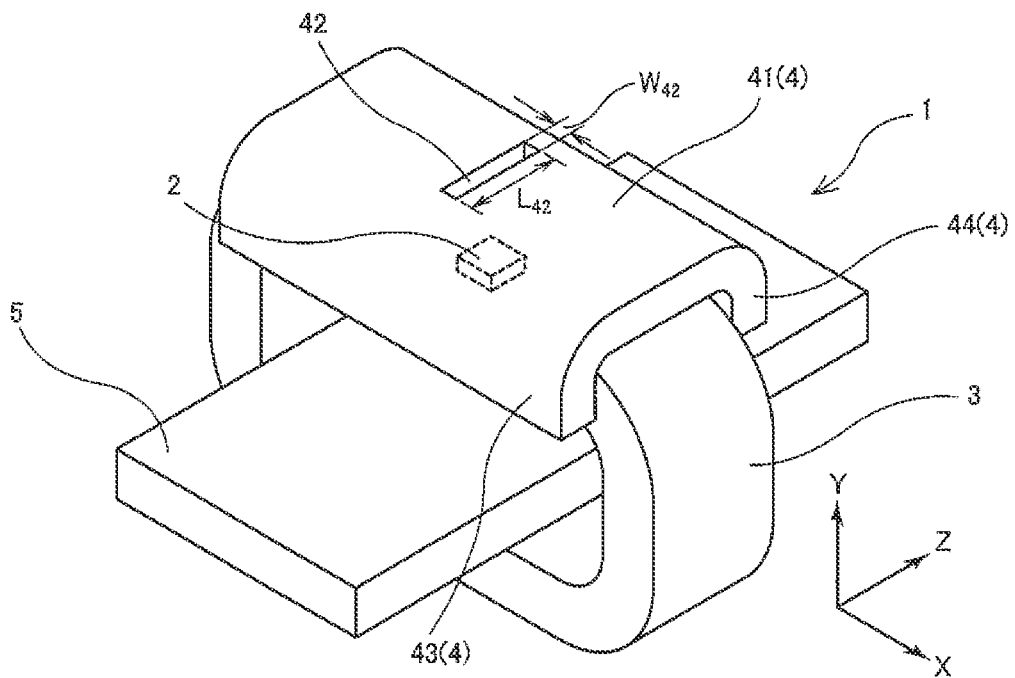
FIG. 18B is a perspective view showing the schematic configuration of a modified example of the second aspect of the current sensor according to the embodiment of the present invention.

Test Example 6 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 18B was used (Sample 6). The simulation results are shown in Table 1.

Figure 18C:
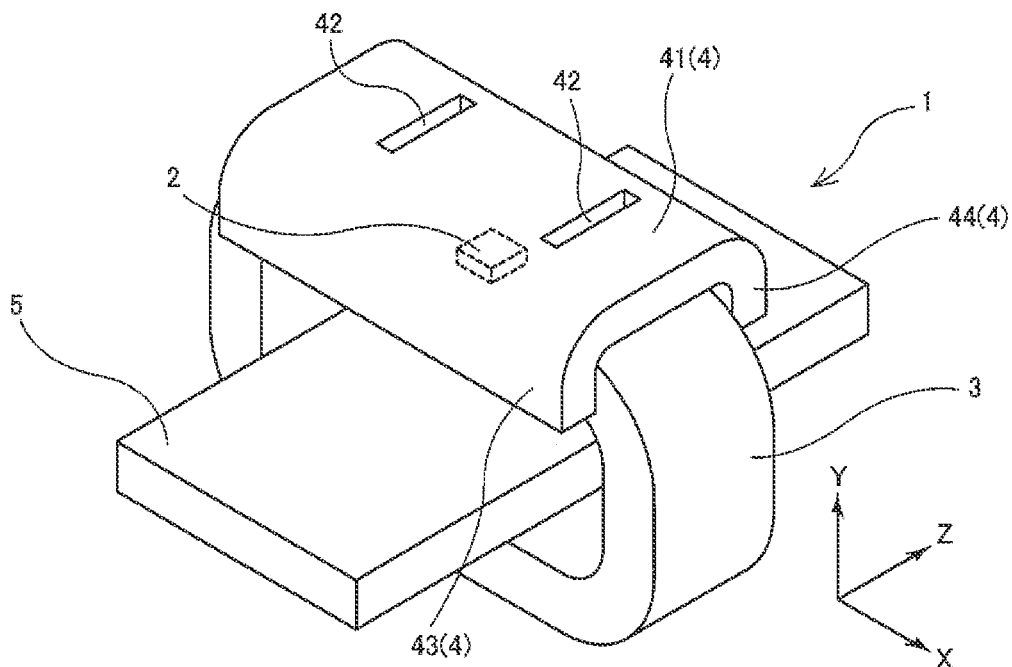
FIG. 18C is a perspective view showing the schematic configuration of a modified example of the second aspect of the current sensor according to the embodiment of the present invention.
Figure 18D:
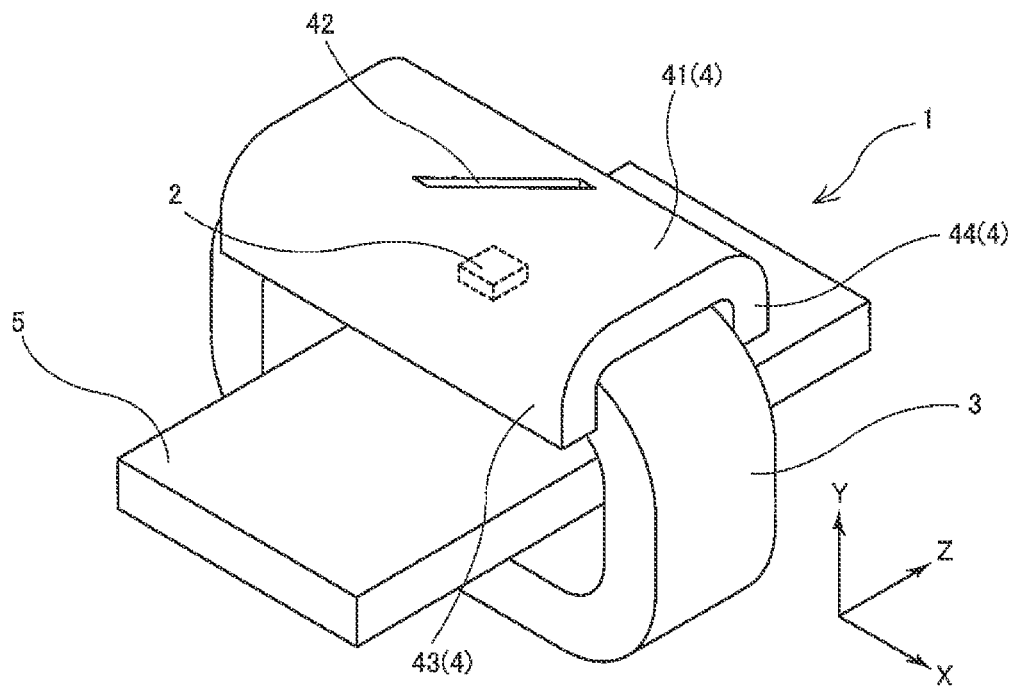
FIG. 18D is a perspective view showing the schematic configuration of a modified example of the second aspect of the current sensor according to the embodiment of the present invention.

Test Example 7 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 18C was used (Sample 7). The simulation results are shown in Table 1.

Test Example 8 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 24 was used (Sample 8). The simulation results are shown in Table 1.

Test Example 9 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that the current sensor 1 having the structure shown in FIG. 28 was used (Sample 9). The simulation results are shown in Table 1.

Test Example 10 The error (EX, %) of the output signal of the current sensor 1 caused by the disturbance magnetic field $H_X$ in the X direction and the error (EY, %) of the output signal of the current sensor 1 caused by the disturbance magnetic field $H_Y$ in the Y direction were calculated in the same manner as in Test Example 1 above, except that no magnetic shield 4 is included (Sample 10). The simulation results are shown in Table 1.

TABLE 1

| | EX (%) | EY (%) |
|---|---|---|
| Sample 1 | 1.89 | 1.96 |
| Sample 2 | 1.24 | 1.45 |
| Sample 3 | 1.24 | 1.45 |
| Sample 4 | 0.90 | 1.45 |
| Sample 5 | 0.97 | 1.43 |
| Sample 6 | 0.93 | 1.41 |
| Sample 7 | 0.88 | 1.41 |
| Sample 8 | 0.72 | 1.50 |
| Sample 9 | 1.08 | 1.64 |
| Sample 10 | 4.66 | 1.67 |

From the results shown in Table 1, it became clear that compared to Test Example 10 (Sample 10) using the current sensor without the magnetic shield 4, in Test Examples 1 to 9 (Sample 1-9) that used the current sensor 1 with the magnetic shield 4 the error of the output signal of the current sensor 1 that can be caused by at least by the disturbance magnetic field $H_X$ in the X direction can be reduced.

Furthermore, from the results of Test Example 1 (Sample 1), Test Example 2 (Sample 2), and Test Example 3 (Sample 3), it was clarified that by forming the slit section 42 in the plate-shaped shield portion 41 of the magnetic shield 4, the error of the output signal of the current sensor 1 that can be caused by the disturbance magnetic field $H_X$ in the X direction and the disturbance magnetic field $H_Y$ in the Y direction can be reduced.

Furthermore, from the results of Test Example 1 (Sample 1) and Test Example 4 (Sample 4), it was clarified that by having the magnetic shield 4 include the plate-shaped shield portion 41 and the first shield portion 43 and the second shield portion 44 that are continuous with both end portions 41A and 41B in the Z direction thereof, the error of the output signal of the current sensor 1 that may be caused by the disturbance magnetic field $H_X$ in the X direction and the disturbance magnetic field $H_Y$ in the Y direction can be reduced.

Figure 32:
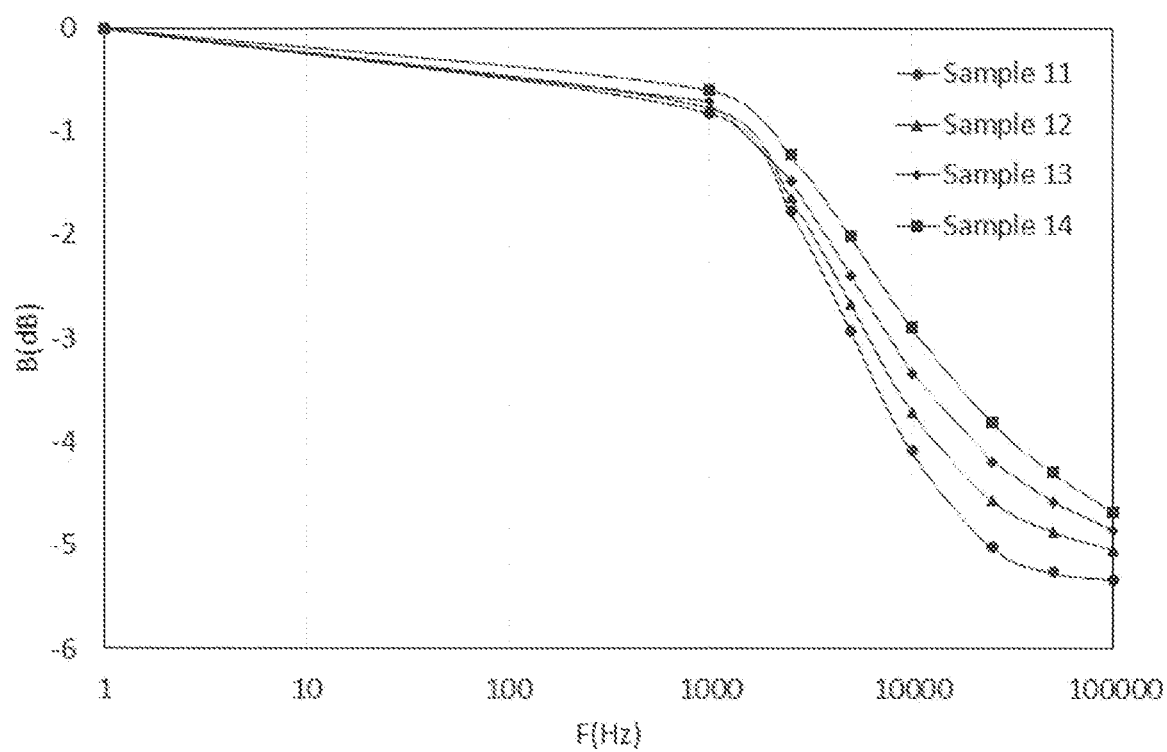
FIG. 32 is a graph showing the frequency characteristics due to the iron loss difference between the constituent material of the magnetization core and the constituent material of the magnetic shield in the current sensor.

Test Example 11 In the current sensor 1 (Sample 11) that has the structure shown in FIG. 13 and uses silicon steel (50H230, manufactured by Nippon Steel Co., Ltd., iron loss: 2.3 W/kg) as a constituent material of the magnetization core 3 and the magnetic shield 4, the amount of attenuation (dB) of the magnetic flux density applied to the magnetic detection element 2 when the frequency of the alternating current flowing through the conductor 5 was changed within the range of 1 Hz to 100 kHz was found through by simulation. The results are shown in FIG. 32.

Test Example 12 In the current sensor 1 (Sample 12) having the same structure as the current sensor 1 of Test Example 11 (Sample 11) other than using silicon steel (50H470, manufactured by Nippon Steel Co., Ltd., iron loss: 4.7 W/kg) as the constituent material of the magnetic shield 4, the amount of attenuation (dB) of the magnetic flux density applied to the magnetic detection element 2 when the frequency of the alternating current flowing through the conductor 5 was changed within the range of 1 Hz to 100 kHz was found through by simulation. The results are shown in FIG. 32.

Test Example 13 In the current sensor 1 (Sample 13) having the same structure as the current sensor 1 of Test Example 11 (Sample 11) other than using silicon steel (50H700, manufactured by Nippon Steel Co., Ltd., iron loss: 7.0 W/kg) as the constituent material of the magnetic shield 4, the amount of attenuation (dB) of the magnetic flux density applied to the magnetic detection element 2 when the frequency of the alternating current flowing through the conductor 5 was changed within the range of 1 Hz to 100 kHz was found through by simulation. The results are shown in FIG. 32.

Test Example 14 In the current sensor 1 (Sample 14) having the same structure as the current sensor 1 of Test Example 11 (Sample 11) other than using silicon steel (50H1000, manufactured by Nippon Steel Co., Ltd., iron loss: 10.0 W/kg) as the constituent material of the magnetic shield 4, the amount of attenuation (dB) of the magnetic flux density applied to the magnetic detection element 2 when the frequency of the alternating current flowing through the conductor 5 was changed within the range of 1 Hz to 100 kHz was found through by simulation. The results are shown in FIG. 32.

As shown in FIG. 32, it became clear that the frequency characteristics of the current sensor 1 can be improved by having the iron loss of the constituent material of the magnetization core 3 be smaller than the iron loss of the constituent material of the magnetic shield 4. Therefore, since the magnetization core 3 is made of a material having a smaller iron loss than the constituent material of the magnetic shield 4, the output from the current sensor 1 can be stabilized even when an alternating current flows through the conductor 5.

DESCRIPTION OF SYMBOLS

1 Current sensor
2 Magnetic detection unit
3 Magnetization core
4 Magnetic shield
5 Conductor

The invention claimed is:

1. A magnetic sensor for detecting magnetism generated from a conductor in which a current flows in a first direction, the magnetic sensor comprising:
a magnetic detection unit capable of detecting the magnetism;
a magnetization core; and
a magnetic shield,
wherein the magnetization core includes a first core section, which is substantially parallel to the first direction, and a second core section and a third core section, which are each continuous from end portions of the first core section in a second direction that is orthogonal to the first direction;
the second core section and the third core section each extend from the end portions of the first core section to follow a third direction that is orthogonal to the first direction and the second direction,
the magnetic detection unit has a sensitivity direction in the second direction and is positioned in a core gap sandwiched between the vicinity of an end portion of the second core section and the vicinity of an end portion of the third core section in the third direction, and
the magnetic shield includes a plate-shaped shield portion positioned to overlap the core gap when viewed along the third direction.

2. The electric sensor according to claim 1, wherein the magnetization core further includes a fourth core section, which is continuous with the vicinity of the end portion of the second core section, and a fifth core section, which is continuous with the vicinity of the end portion of the third core section, wherein the fourth core section and the fifth core section extend to approach one another along the second direction.

3. The electric sensor according to claim 1, wherein the conductor is a plate-shaped body extending in the first direction, and
a thickness direction of the conductor is the third direction.

4. The electric sensor according to claim 1, wherein the conductor is a plate-shaped body extending in the first direction, and
a thickness direction of the conductor is the second direction.

5. The electric sensor according to claim 1, wherein the magnetic shield includes a first shield portion and a second shield portion that extend along the third direction and are respectively continuous with ends of the plate-shaped shield portion along the first direction, and
the magnetic detection unit is positioned in the core gap sandwiched between the first shield portion and the second shield portion when viewed along the first direction.

6. The electric sensor according to claim 1, wherein a slit section penetrating in the third direction is formed in the plate-shaped shield portion.

7. The electric sensor according to claim 6, wherein a lengthwise direction of the slit section substantially matches the first direction when viewed along the third direction.

8. The electric sensor according to claim 6, wherein a lengthwise direction of the slit section substantially matches the second direction when viewed along the third direction.

9. The electric sensor according to claim 6, wherein the slit section is one of a plurality of slit sections formed in the plate-shaped shield portion.

10. The electric sensor according to claim 1, wherein the iron loss of the constituent materials of the magnetic shield is larger than the iron loss of the constituent materials of the magnetization core.

11. The electric sensor according to claim 1, wherein the magnetic detection unit includes a magnetoresistive effect element or a Hall element.

12. The electric sensor according to claim 11, wherein the magnetoresistive effect element is a GMR element or a TMR element.

13. The electric sensor according to claim 1, wherein the conductor is provided to penetrate the gap formed by the first core section, the second core section and the third core section of the magnetization core along the first direction.

14. An electric control device provided with the current sensor according to claim 13.

* * * * *